United States Patent
Dahal et al.

(10) Patent No.: US 12,463,050 B2
(45) Date of Patent: Nov. 4, 2025

(54) METHODS FOR WET ATOMIC LAYER ETCHING OF MOLYBDENUM

(71) Applicant: Tokyo Electron Limited, Tokyo (JP)

(72) Inventors: Tulashi Dahal, Austin, TX (US); Paul Abel, Austin, TX (US); Mengistie Debasu, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 224 days.

(21) Appl. No.: 18/240,142

(22) Filed: Aug. 30, 2023

(65) Prior Publication Data

US 2025/0079180 A1    Mar. 6, 2025

(51) Int. Cl.
  *H01L 21/311* (2006.01)
  *H01L 21/02* (2006.01)

(52) U.S. Cl.
  CPC .... *H01L 21/31111* (2013.01); *H01L 21/0206* (2013.01); *H01L 21/02068* (2013.01); *H01L 21/02175* (2013.01); *H01L 21/02244* (2013.01)

(58) Field of Classification Search
  CPC ........... H01L 21/31111; H01L 21/0206; H01L 21/02068; H01L 21/02175; H01L 21/02244; H01L 21/32134
  USPC ........................................................ 438/745
  See application file for complete search history.

(56) References Cited

U.S. PATENT DOCUMENTS

| | | |
|---|---|---|
| 8,961,814 B2 | 2/2015 | Van Duren et al. |
| 9,365,770 B2 | 6/2016 | Okabe et al. |
| 9,768,327 B2 | 9/2017 | Woehl et al. |
| 10,096,487 B2 | 10/2018 | Yang et al. |
| 10,982,335 B2 | 4/2021 | Abel |
| 2005/0233578 A1* | 10/2005 | Jia ............... H01L 21/32125 438/692 |

(Continued)

FOREIGN PATENT DOCUMENTS

CN    108206070 A  *  6/2018  ............... H01B 5/14

OTHER PUBLICATIONS

Wikipedia, Acetate (Year: 2005).*

(Continued)

*Primary Examiner* — Duy Vu N Deo
(74) *Attorney, Agent, or Firm* — Egan, Enders & Huston LLP.

(57) ABSTRACT

Systems and methods are provided for etching molybdenum in a wet ALE process. The methods disclosed herein use a wide variety of techniques and wet etch chemistries to oxidize a molybdenum surface and form a self-limiting, molybdenum oxide passivation layer in a surface modification step of the wet ALE process. For example, the methods use: (a) ultra-violet (UV) photolysis of peroxide oxidizers to create oxidizing radicals, which limit oxidation of the molybdenum surface and provide quasi-self-limiting oxidation behavior, (b) steric hinderance of oxidizers having large reactant molecules to achieve better self-limiting oxidation behavior, and/or (c) ligand-assisted oxidation to change the surface chemistry of the molybdenum oxide passivation layer and ensure self-limiting oxidation behavior. After forming the molybdenum oxide passivation layer using one or more of the oxidation techniques disclosed herein, the passivation layer is selectively removed in a dissolution step of the wet ALE process to etch the molybdenum surface.

22 Claims, 22 Drawing Sheets

(56) References Cited

U.S. PATENT DOCUMENTS

| | | |
|---|---|---|
| 2017/0053810 A1 | 2/2017 | Yang et al. |
| 2019/0198392 A1 | 6/2019 | Mulllick et al. |
| 2020/0118835 A1 | 4/2020 | Kanarik |
| 2020/0161148 A1* | 5/2020 | Abel ................. C23F 1/08 |
| 2020/0286743 A1 | 9/2020 | Lai et al. |
| 2020/0312620 A1 | 10/2020 | Blomberg et al. |
| 2022/0148885 A1 | 5/2022 | Abel et al. |
| 2022/0365434 A1 | 11/2022 | Nardi et al. |
| 2023/0117790 A1 | 4/2023 | Abel |
| 2023/0118554 A1 | 4/2023 | Abel |
| 2023/0121246 A1 | 4/2023 | Abel |
| 2023/0140900 A1 | 5/2023 | Netzband et al. |
| 2024/0327983 A1* | 10/2024 | Leoncini ............. C23C 16/458 |

OTHER PUBLICATIONS

Chemistry Libre Texts—carboxylic acid (Year: 2025).*
International Search Report and The Written Opinion; Application No. PCT/US2024/036702; Oct. 24, 2024, 11 pgs.
Dahal et al., Methods for Wet Atomic Layer Etching of Tungsten, U.S. Appl. No. 18/619,491, filed Mar. 28, 2024, 67 pgs.
Dahal et al., "Methods for Wet Atomic Layer Etching of Molybdenum in Aqueous Solution", U.S. Appl. No. 18/636,818, filed Apr. 16, 2024, 62 pgs.

* cited by examiner

METHODS FOR WET ATOMIC LAYER ETCHING OF MOLYBDENUM

BACKGROUND

This disclosure relates to semiconductor device manufacturing, and, in particular, to the removal and etching of polycrystalline materials, such as transition metals.

During routine semiconductor fabrication, various metals formed on a substrate may be removed by patterned etching, chemical-mechanical polishing, as well as other techniques. A variety of techniques are known for etching layers on a substrate, including plasma-based etching (otherwise referred to as dry etching) and liquid-based etching (otherwise referred to as wet etching). Wet etching generally involves dispensing a chemical solution over the surface of a substrate or immersing the substrate in the chemical solution. The chemical solution often contains a solvent, chemicals designed to react with materials on the substrate surface and chemicals to promote dissolution of the reaction products. As a result of exposure of the substrate surface to the etchant, material is removed from the substrate. Etchant composition and temperature may be controlled to control the etch rate, specificity and residual material on the surface of the substrate post-etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless of crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE is a process that removes thin layers sequentially through one or more self-limiting reactions. For example, ALE typically refers to techniques that can etch with atomic precision, i.e., by removing material one monolayer (or a few monolayers) of material at a time. ALE processes generally rely on a chemical modification of the surface to be etched followed by a selective removal of the modified layer. Thus, ALE processes offer improved performance by decoupling the etch process into sequential steps of surface modification and removal of the modified surface. In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process leads to smoothing of the surface during etching rather than the roughening commonly seen during other etch processes.

A wet ALE process typically begins with a surface modification step, which exposes a material to a first solution to create a self-limiting modified surface layer. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

Recently, molybdenum (Mo) is being considered as a metal for middle of line metallization, memory applications and new integration schemes, such as buried power rails. Many of these applications require etch back operations where the surface morphology of the post-etch surface is critical to device performance. However, the polycrystalline nature of molybdenum makes it susceptible to pitting if an etchant reacts at the grain boundaries with faster kinetics than the grain surface. Etchant chemistry should, at a minimum, leave the surface no rougher than it was initially, and ideally, improve the surface roughness during etching. Unfortunately, wet etch chemistries traditionally used for etching molybdenum result in a rough post-etch surface. Accordingly, new wet etch chemistries are needed for etching molybdenum.

SUMMARY

The present disclosure provides improved wet etch processes and methods for etching polycrystalline materials. More specifically, the present disclosure provides various embodiments of wet etch processes and methods that utilize new etch chemistries for etching transition metals, such as molybdenum (Mo), in a wet etch process.

As described in more detail below, the embodiments disclosed herein expose a transition metal surface to a first etch solution to chemically modify the transition metal surface and form a modified surface layer (otherwise referred to herein as a passivation layer), which can be selectively dissolved in a second etch solution to etch the transition metal surface. The first etch solution may generally include an oxidizer dissolved in a non-aqueous solvent. The oxidizer included within the first etch solution reacts with the transition metal surface to oxidize the transition metal surface and form a transition metal oxide passivation layer, which is self-limiting and insoluble in the non-aqueous solvent. In some embodiments, the first etch solution may also include a ligand species. The ligand species reacts with and binds to the transition metal oxide passivation layer to change the surface chemistry of the transition metal oxide passivation layer, thereby ensuring that the transition metal oxide passivation layer is self-limiting and insoluble in the non-aqueous solvent.

A wide variety of techniques and etch chemistries are disclosed herein for oxidizing an exposed surface of a transition metal (such as, e.g., molybdenum, Mo) and forming a self-limiting transition metal oxide passivation layer (such as, e.g., $MoO_3$) on the underlying transition metal (e.g., metallic Mo). For example, the embodiments disclosed herein may use: (a) ultra-violet (UV) photolysis of peroxide oxidizers to create oxidizing radicals, which limit oxidation of the molybdenum surface and provide quasi-self-limiting oxidation behavior, (b) steric hinderance of oxidizers having relatively large reactant molecules to achieve better self-limiting oxidation behavior, and/or (c) ligand-assisted oxidation to change the surface chemistry of the transition metal oxide passivation layer and ensure self-limiting oxidation behavior. After forming the self-limiting transition metal oxide passivation layer using one or more of the oxidation techniques disclosed herein, the second etch solution may be dispensed onto the surface of the substrate to selectively dissolve the transition metal oxide passivation layer, thus removing the transition metal oxide passivation layer from the substrate surface without etching the underlying transition metal (e.g., metallic Mo). Several etch chemistries can be used to selectively dissolve molybdenum oxides (such as, e.g., $MoO_3$) without dissolving metallic Mo, as described in more detail below.

According to one embodiment, a method is provided herein for etching a substrate having a molybdenum layer formed thereon. In some embodiments, the method may begin by receiving a substrate having a molybdenum (Mo) layer formed thereon, where a molybdenum surface is exposed on a surface of the substrate, and exposing the surface of the substrate to a surface modification solution comprising an oxidizer dissolved in a non-aqueous solvent. The oxidizer reacts with the molybdenum surface to oxidize the molybdenum surface and form a molybdenum oxide passivation layer, which is self-limiting and insoluble in the non-aqueous solvent. The method further includes removing the surface modification solution from the surface of the substrate subsequent to forming the molybdenum oxide passivation layer, and exposing the surface of the substrate to a dissolution solution to selectively remove the molybdenum oxide passivation layer. The dissolution solution reacts with the molybdenum oxide passivation layer to form soluble species that are dissolved by the dissolution solution. The method further includes removing the dissolution solution and the soluble species from the surface of the substrate to etch the molybdenum layer. In some embodiments, the steps of exposing the surface of the substrate to the surface modification solution, removing the surface modification solution, exposing the surface of the substrate to the dissolution solution, and removing the dissolution solution and the soluble species may be repeated a number of times until a predetermined amount of the molybdenum layer is removed from the substrate.

The method disclosed above may use a wide variety of oxidation techniques and surface modification solution chemistries to oxidize the molybdenum surface and form the self-limiting, molybdenum oxide passivation layer.

In a first embodiment, the method uses ultra-violet (UV) photolysis of peroxide oxidizers to create oxidizing radicals, which limit oxidation of the molybdenum surface and provide quasi-self-limiting oxidation behavior. For example, the method may expose the surface of the substrate to UV radiation during said exposing the surface of the substrate to the surface modification solution to photolyze the oxidizer and create oxidizing radicals, which react with the molybdenum surface to oxidize the molybdenum surface and form the molybdenum oxide passivation layer. Because the lifetime of the oxidizing radicals is relatively short, the use of oxidizing radicals as an oxidizer limits oxidation of the molybdenum oxide passivation layer to provide quasi-self-limiting oxidation behavior.

In the first embodiment, the oxidizer may be a peroxide oxidizer and the non-aqueous solvent may be an organic solvent. Examples of peroxide oxidizers that may be used in the first embodiment include, but are not limited to, hydrogen peroxide ($H_2O_2$), a symmetric organic peroxide (such as di-tert-butyl peroxide ($C_8H_{18}O_2$)), an asymmetric organic peroxide (such as tert-butylperoxybenzoate ($C_{11}H_{14}O_3$)), a monoperoxide (such as tert-butyl hydroperoxide ($C_4H_{10}O_2$)), or a peroxy acid (such as peroxyacetic acid, or peracetic acid, ($C_2H_4O_3$)). The non-aqueous organic solvent can be methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. In one embodiment, the oxidizer used in the first embodiment may be hydrogen peroxide ($H_2O_2$) and the non-aqueous organic solvent may be isopropyl alcohol (IPA). However, other combinations of peroxide oxidizers and non-aqueous organic solvents may also be used in the first embodiment.

In a second embodiment, the method uses steric hinderance of oxidizers to achieve better self-limiting oxidation behavior. The oxidizer used in the second embodiment may generally comprise a relatively large reactant molecule (e.g., a reactant molecule having a molecular size substantially greater than 2 angstroms), which has a smaller diffusion coefficient than a smaller reactant molecule (e.g., a reactant molecule having a molecular size less than 2 angstroms). The smaller diffusion coefficient of the large reactant molecule reduces an oxidation rate at which the oxidizer oxidizes the molybdenum surface to form the molybdenum oxide passivation layer. Thus, the second embodiment of the method improves the self-limiting oxidation behavior of the oxidizer by leveraging the steric hinderance of larger reactant molecules to reduce the oxidation rate at which the oxidizer oxidizes the molybdenum surface.

The oxidizer used in the second embodiment may be a peroxide oxidizer or a non-peroxide oxidizer. Examples of non-peroxide oxidizers that may be used in the second embodiment include, but are not limited to, ammonium persulfate (APS), ferric chloride ($FeCl_3$), osmium tetroxides, ruthenium tetroxides, ruthenates, manganates, permanganates, periodates, and metal nitrates. Examples of peroxide oxidizers include organic peroxides, such as but not limited to, di-tert-butyl peroxide ($C_8H_{18}O_2$) and tert-butyl peroxybenzoate ($C_{11}H_{14}O_3$). The non-aqueous solvent used in the second embodiment may be an organic solvent selected from a group comprising methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone and an acetate. In one embodiment, the non-peroxide oxidizer may be ammonium persulfate (APS) and the non-aqueous solvent may be methanol ($CH_3OH$). In another embodiment, the non-peroxide oxidizer may be ferric chloride ($FeCl_3$) and the non-aqueous solvent may be isopropyl alcohol (IPA) or acetone. When ferric chloride is used as the oxidizer, the ferric chloride reacts with the molybdenum surface to oxidize the molybdenum surface and form a molybdenum oxychloride passivation layer, which is self-limiting and insoluble in the non-aqueous solvent. Other combinations of oxidizers and non-aqueous organic solvents may also be used in the second embodiment.

In a third embodiment, the method uses ligand-assisted oxidation to change the surface chemistry of the molybdenum oxide passivation layer and ensure self-limiting oxidation behavior. The surface modification solution used in the third embodiment includes the oxidizer, the non-aqueous solvent and a ligand species, which reacts with the molybdenum oxide passivation layer to change a surface chemistry of the molybdenum oxide passivation layer. By changing the surface chemistry of the molybdenum oxide passivation layer, the third embodiment of the method ensures that the molybdenum oxide passivation layer is self-limiting and insoluble in the non-aqueous solvent.

In the third embodiment, the oxidizer may be a peroxide oxidizer or a non-peroxide oxidizer, the non-aqueous solvent may be an organic solvent and the ligand species may be a carboxylic acid. Examples of non-peroxide oxidizers that may be used in the third embodiment include, but are not limited to, ammonium persulfate (APS), ferric chloride ($FeCl_3$), osmium tetroxides, ruthenium tetroxides, ruthenates, manganates, permanganates, periodates, and metal nitrates. Examples of peroxide oxidizers include hydrogen peroxide ($H_2O_2$), organic peroxides (such as di-tert-butyl peroxide ($C_8H_{18}O_2$) and tert-butyl peroxybenzoate ($C_{11}H_{14}O_3$)), monoperoxides (such as tert-butyl hydroperoxide ($C_4H_{10}O_2$)), peroxy acids (such as peracetic acid ($C_2H_4O_3$)). The non-aqueous organic solvent used in the third embodiment may be selected from a group comprising methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, ketones and acetates. The ligand species may be oxalic acid, acetic acid, ascorbic acid, mandelic acid, malic acid, maleic acid or fumaric acid. In one embodiment, the oxidizer may be APS, the organic solvent may be methanol and the ligand may be oxalic acid. However, other combinations of oxidizers, non-aqueous organic solvents and ligand species may also be used in the third embodiment.

A wide variety of dissolution solutions may be used in the method embodiments described above. For example, the dissolution solution may be: (a) an aqueous acid solution comprising hydrochloric acid (HCl), nitric acid or sulfuric acid, (b) an aqueous basic solution comprising ammonium hydroxide ($NH_4OH$), tetramethylammonium hydroxide (TMAH), potassium hydroxide (KOH) or calcium hydroxide ($Ca(OH)_2$), or (c) a non-aqueous ligand solution comprising alpha-benzoin oxime in acetone, dimethyl sulfoxide (DMSO), methyl-ethyl ketone (MEK) or another ketone.

According to another embodiment, a method is provided herein for etching a substrate using a wet atomic layer etching (ALE) process. In some embodiments, the method may begin by receiving the substrate, the substrate having a molybdenum (Mo) layer formed thereon, wherein a molybdenum surface is exposed on a surface of the substrate. The method further includes selectively etching the molybdenum layer by performing multiple cycles of the wet ALE process, wherein each cycle comprises: (a) exposing the molybdenum surface to a first etch solution comprising an oxidizer and a ligand species in a non-aqueous solvent to form a chemically modified Mo surface layer that is self-limiting and insoluble in the non-aqueous solvent; (b) rinsing the substrate with a first purge solution to remove the first etch solution from the surface of the substrate; (c) exposing the chemically modified Mo surface layer to a second etch solution to dissolve the chemically modified Mo surface layer; and (d) rinsing the substrate with a second purge solution to remove the second etch solution from the surface of the substrate.

In the method disclosed above, the oxidizer included within the first etch solution reacts with the molybdenum surface to oxidize the molybdenum surface and form the chemically modified Mo surface layer. The ligand species included within the first etch solution reacts with the chemically modified Mo surface layer to change a surface chemistry of the chemically modified Mo surface layer. Changing the surface chemistry ensures that the chemically modified Mo surface layer is self-limiting and insoluble in the non-aqueous solvent.

A wide variety of oxidizers, ligand species and non-aqueous solvents may be used in the first etch solution. For example, the oxidizer may be a non-peroxide oxidizer such as, but not limited to, ammonium persulfate (APS), ferric chloride ($FeCl_3$), osmium tetroxides, ruthenium tetroxides, ruthenates, manganates, permanganates, periodates, and metal nitrates. Alternatively, the oxidizer may be a peroxide oxidizer such as, but not limited to, hydrogen peroxide ($H_2O_2$), an organic peroxide (such as di-tert-butyl peroxide ($C_8H_{18}O_2$) and tert-butyl peroxybenzoate ($C_{11}H_{14}O_3$)), a monoperoxide (such as tert-butyl hydroperoxide ($C_4H_{10}O_2$)), or a peroxy acid (such as peracetic acid ($C_2H_4O_3$)). The non-aqueous solvent may be an organic solvent, such as methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. The ligand species may be a carboxylic acid, such as oxalic acid, acetic acid, ascorbic acid, mandelic acid, malic acid, maleic acid or fumaric acid.

The second etch solution may include a variety of reactants dissolved in aqueous and non-aqueous solutions. For example, the second etch solution may be: (a) an aqueous acid solution comprising hydrochloric acid (HCl), nitric acid or sulfuric acid, (b) an aqueous basic solution comprising ammonium hydroxide ($NH_4OH$), tetramethylammonium hydroxide (TMAH), potassium hydroxide (KOH) or calcium hydroxide ($Ca(OH)_2$), or (c) a non-aqueous ligand solution comprising alpha-benzoin oxime in acetone, dimethyl sulfoxide (DMSO), methyl-ethyl ketone (MEK) or another ketone.

The methods disclosed herein may be used to etch a wide variety of materials, including polycrystalline materials, single-crystalline materials and amorphous materials. In some embodiments, the methods disclosed herein may be used to etch a transition metal. Examples of transition metals that may be etched using the methods disclosed herein include, but are not limited to, molybdenum (Mo), cobalt (Co), copper (Cu), tungsten (W), vanadium (V), niobium (Nb), tantalum (Ta), titanium (Ti), chromium (Cr) and nickel (Ni).

Note that this Summary Section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
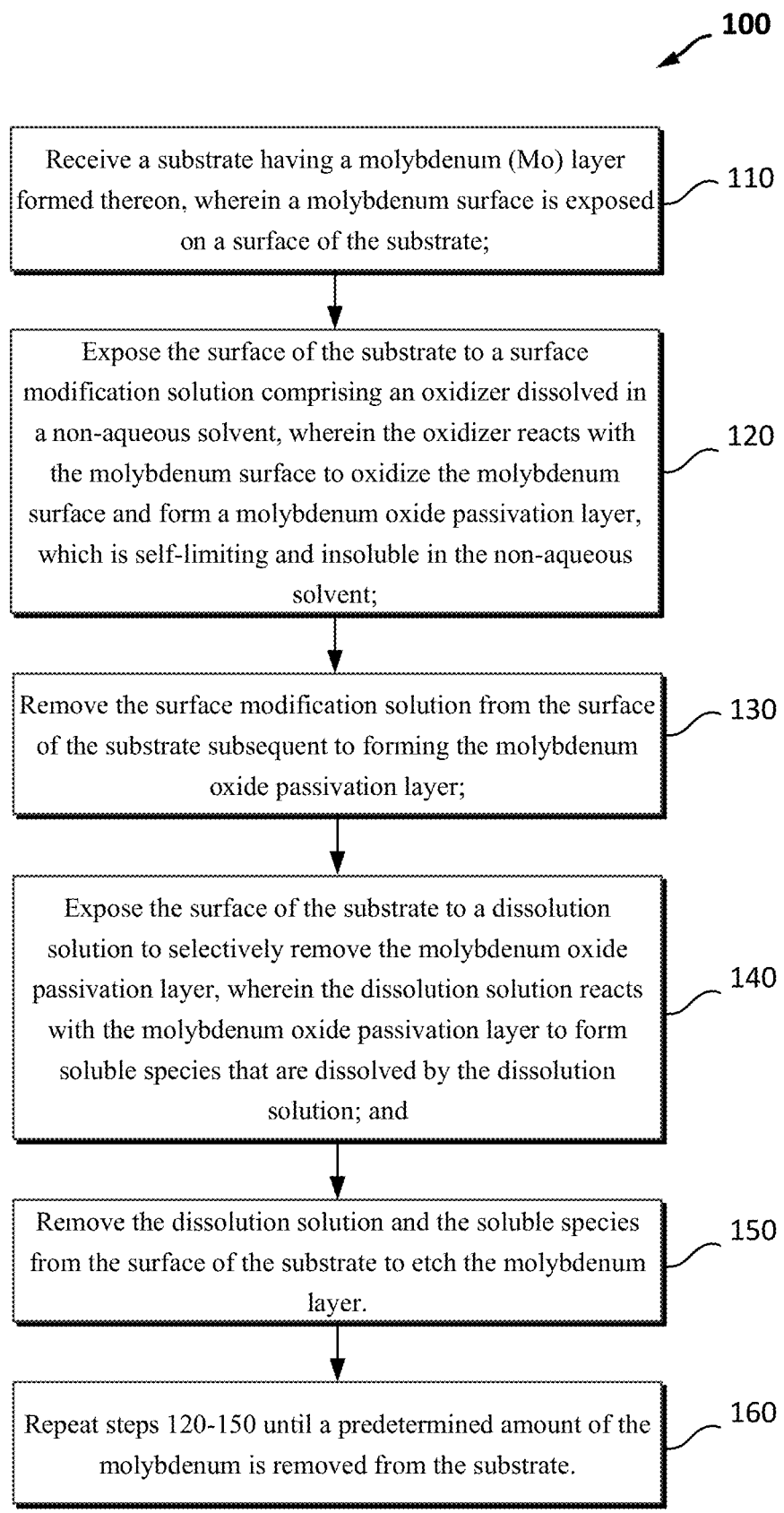
FIG. 1 is a flowchart diagram illustrating one embodiment of a method that utilizes the techniques disclosed herein for etching a substrate using a cyclic wet atomic layer etching (ALE) process.

Wet ALE processes can be used to etch transition metals formed on a substrate by performing one or more cycles of the wet ALE process, where each cycle includes a surface modification step and a dissolution step. In the surface modification step, an exposed surface of the transition metal may be exposed to a surface modification solution containing an oxidizer to chemically modify the exposed surface of the transition metal and form a modified surface layer (e.g., a transition metal oxide passivation layer). In the dissolution step, the modified surface layer may be selectively removed by exposing the modified surface layer to a dissolution solution to dissolve the modified surface layer. Purge steps may be performed between the surface modification and dissolution steps to prevent the surface modification and dissolution solutions from mixing, and the process may be repeated in a cyclic manner until a desired amount of etching is achieved. In order to achieve atomic layer etching, however, at least one of the surface modification and dissolutions steps must be self-limiting.

A variety of transition metals may be etched using wet ALE processes, including cobalt (Co), ruthenium (Ru), copper (Cu), gold (Au), platinum (Pt), Iridium (Ir), etc. Wet ALE processes for etching such transition metals are disclosed in U.S. Pat. No. 10,982,335, entitled "Wet Atomic Layer Etching Using Self-Limiting and Solubility-limited Reactions," US Patent Application Publication No. 2023/0118554, entitled "Methods for Wet Atomic Layer Etching of Ruthenium," US Patent Application Publication No. 2023/0140900, entitled "Methods for Wet Atomic Layer Etching of Copper" and US Patent Application Publication No. 2023/0121246, "Methods for Wet Atomic Layer Etching of Noble Metals," each of which is incorporated herein by reference.

Molybdenum (Mo) is another transition metal used in semiconductor manufacturing. However, developing wet ALE chemistries for etching molybdenum is difficult because many surface reactions do not lead to self-limiting behavior. For example, although molybdenum trioxide ($MoO_3$) is an easily formed modified surface layer, it is difficult to form in a self-limiting manner using wet chemistries. This difficulty arises because of the solubility of $MoO_3$. Since $MoO_3$ is soluble in aqueous solution, all oxidations must take place in non-aqueous solutions. However, strong oxidizers (such as hydrogen peroxide, $H_2O_2$) can pull molybdenum into solution even in non-aqueous solutions, leading to oxidation behavior that is not self-limiting. Strong oxidizers also cause preferential grain boundaries attack, leading to a continuous etch of the molybdenum surface. Selective dissolution of the modified surface layer is also challenging, due to graded oxide formation. Both of these conditions lead to inconsistent etch amount of the molybdenum surface per ALE cycle (both within wafer and from wafer to wafer) and increased post-etch surface roughness of the molybdenum surface, which negatively impacts resistive-capacitive (RC) time delay in the integrated circuit. To mitigate these challenges, new wet ALE chemistries and techniques are needed for etching molybdenum and other transition metals.

The present disclosure provides a new wet atomic layer etch (ALE) process for etching a transition metal formed on a substrate. More specifically, the present disclosure provides various embodiments of methods that utilize new etch chemistries for etching molybdenum (Mo) in a wet ALE process. As described in more detail below, the wet ALE processes and methods disclosed herein may use a wide variety of techniques and etch chemistries to oxidize a molybdenum surface exposed on a substrate and form a self-limiting, molybdenum oxide passivation layer (such as, e.g., $MoO_3$) on the underlying Mo surface (e.g., metallic Mo) in a surface modification step of the wet ALE process. For example, the wet ALE processes and methods disclosed herein may use: (a) ultra-violet (UV) photolysis of peroxide oxidizers to create oxidizing radicals, which limit oxidation of the molybdenum surface and provide quasi-self-limiting oxidation behavior, (b) steric hinderance of oxidizers having relatively large reactant molecules to achieve better self-limiting oxidation behavior, and/or (c) ligand-assisted oxidation to change the surface chemistry of the molybdenum oxide passivation layer and ensure self-limiting oxidation behavior. As used herein, a "self-limiting" oxidation behavior, or "self-limiting" reaction, is one in which the rate of oxidation (or other reaction) goes to zero over time. In comparison to a strictly self-limiting reaction, a "quasi-self-limiting" reaction is one in which the rate of oxidation (or other reaction) decreases over time but does not go to zero. After forming a molybdenum oxide passivation layer using one or more of the oxidation techniques disclosed herein, the molybdenum oxide passivation layer is selectively removed in a dissolution step of the wet ALE process to etch the molybdenum surface.

The techniques disclosed herein may be performed on a wide variety of substrates having a wide variety of layers and features formed thereon. In general, the substrates utilized with the techniques disclosed herein may be any substrates for which the etching of material is desirable. For example, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

The techniques disclosed herein may be used to etch a wide variety of materials, including polycrystalline materials, single-crystalline materials and amorphous materials. In some embodiments, the techniques described herein may be used to etch a metal material such as, but not limited to, transition metals and noble metals. In one exemplary embodiment, the material to be etched may be molybdenum. Although the techniques described herein are discussed below in reference to etching molybdenum, it will be recognized by those skilled in the art that such an example is merely exemplary and the techniques described herein may be used to etch a wide variety of other materials. For example, the techniques described herein may be used to etch other transition metals such as, but not limited to, cobalt (Co), copper (Cu), tungsten (W), vanadium (V), niobium (Nb), tantalum (Ta), titanium (Ti) and chromium (Cr), nickel (Ni) and combinations thereof.

The techniques disclosed herein offer multiple advantages over other etch techniques used for etching transition metals. For example, the techniques disclosed herein provide the benefits of ALE, such as precise control of total etch amount, control of surface roughness, and improvements in wafer-scale uniformity. The techniques disclosed herein also provide various benefits of wet etching, such as the simplicity of the etch chamber, self-limiting reactions at near atmospheric temperature and pressure etching conditions, and reduced surface roughness. Unlike conventional etch processes used to etch transition metals, such as molybdenum, the techniques disclosed herein provide a wet ALE process that provides a self-limiting oxidation step and a selective dissolution step for etching the transition metal. As such, the techniques described herein provide unique methods for etching molybdenum.

FIG. 1 illustrates one embodiment of a method 100 that can be used to etch a substrate using a wet atomic layer etching (ALE) process. More specifically, FIG. 1 illustrates an embodiment of a method 100 that can be used to etch a molybdenum (Mo) layer formed on a substrate using a wet ALE process. It will be recognized that the embodiment of FIG. 1 is merely exemplary and additional methods may utilize the wet ALE techniques described herein. Further, additional processing steps may be added to the method shown in the FIG. 1 as the steps described are not intended to be exclusive. Moreover, the order of the steps is not limited to the order shown in the figures as different orders may occur and/or various steps may be performed in combination or at the same time.

The method 100 shown in FIG. 1 includes receiving a substrate having a molybdenum (Mo) layer formed thereon, wherein a molybdenum surface is exposed on a surface of the substrate (in step 110), and exposing the surface of the substrate to a surface modification solution comprising an oxidizer dissolved in a non-aqueous solvent (in step 120). The oxidizer included within the surface modification solution reacts with the molybdenum surface to oxidize the molybdenum surface and form a molybdenum oxide passivation layer, which is self-limiting and insoluble in the non-aqueous solvent. A wide variety of oxidizers may be included within the surface modification solution, as described in more detail below.

After forming the self-limiting molybdenum oxide passivation layer, method 100 removes the surface modification solution from the surface of the substrate (in step 130), and exposes the surface of the substrate to a dissolution solution to selectively remove the molybdenum oxide passivation layer (in step 140). The dissolution solution reacts with the molybdenum oxide passivation layer to form soluble species that are dissolved by the dissolution solution. The method 100 removes the dissolution solution and the soluble species from the surface of the substrate to etch the molybdenum layer (in step 150). In some embodiments, the method may repeat steps 120-150 a number of times (in step 160) until a predetermined amount of the molybdenum is removed from the substrate.

The method 100 shown in FIG. 1 may utilize a wide variety of techniques and etch chemistries to oxidize the molybdenum surface and form the self-limiting, molybdenum oxide passivation layer in step 120. For example, the method 100 shown in FIG. 1 may use: (a) ultra-violet (UV) photolysis of peroxide oxidizers to create oxidizing radicals, which limit oxidation of the molybdenum surface and provide quasi-self-limiting oxidation behavior, (b) steric hinderance of oxidizers having relatively large reactant molecules to achieve better self-limiting oxidation behavior, and/or (c) ligand-assisted oxidation to change the surface chemistry of the molybdenum oxide passivation layer and ensure self-limiting oxidation behavior. Example etch chemistries that may be used in the surface modification step (step 120), the dissolution step (step 140) and the purge steps (steps 130 and 150) for each of the oxidation techniques above-mentioned are described in more detail below.

UV Photolysis of Oxidizers

Figure 2:
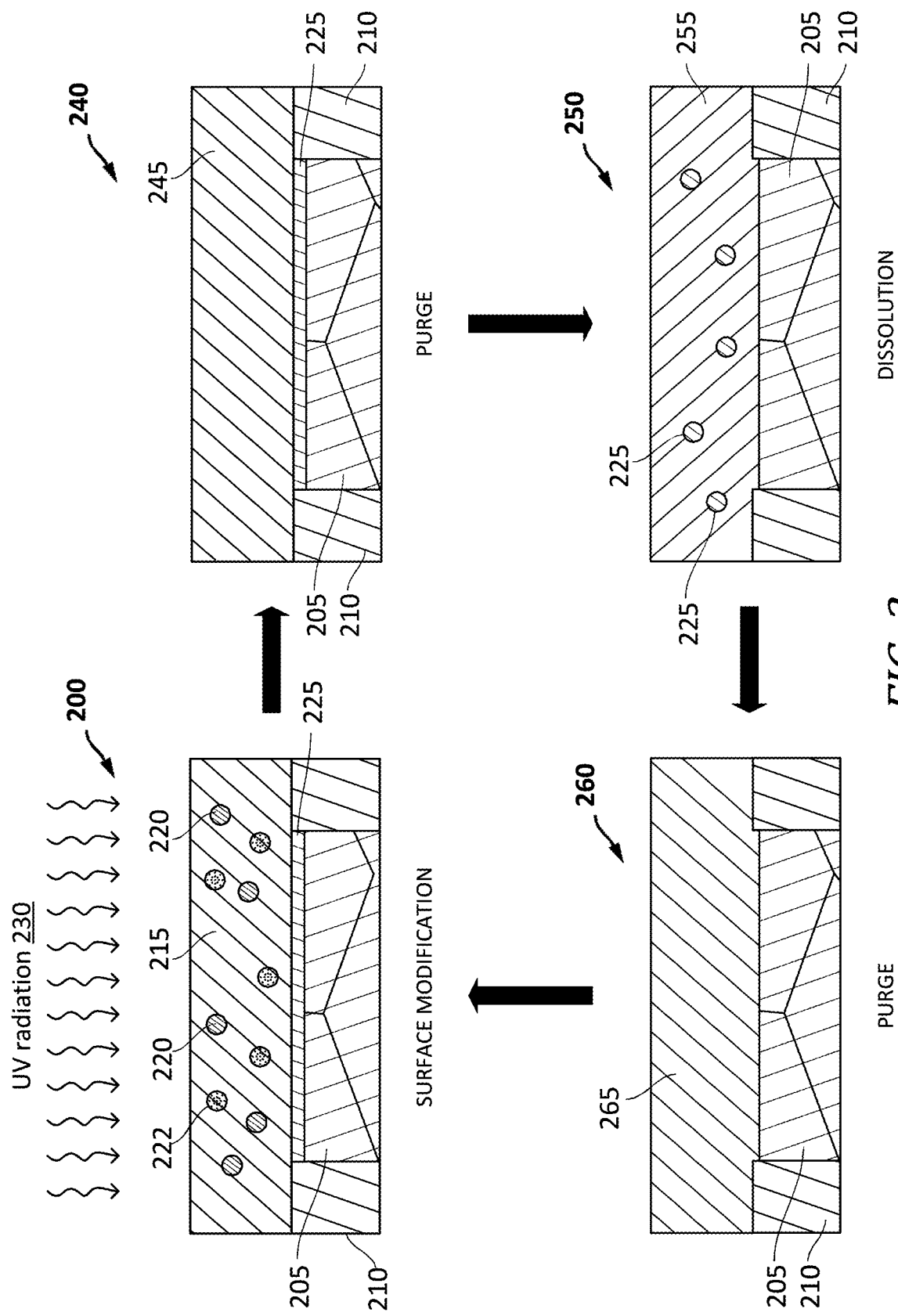
FIG. 2 illustrates one example of a cyclic wet ALE process that can be used to etch a transition metal surface, such as a molybdenum surface, in accordance with a first embodiment of the present disclosure.

FIG. 2 illustrates one example of a wet ALE process that can be used to etch molybdenum in accordance with a first embodiment of the present disclosure. As described in more detail below, the wet ALE process shown in FIG. 2 is a cyclical process consisting of one or more ALE cycles, where each ALE cycle includes a surface modification step 200, a first purge step 240, a dissolution step 250 and a second purge step 260.

In the wet ALE process shown in FIG. 2, a molybdenum layer 205 surrounded by a dielectric material 210 is brought in contact with a surface modification solution 215 during the surface modification step 200. The surface modification solution 215 contains an oxidizer 220 dissolved in a non-aqueous solvent. In some embodiments, the oxidizer 220 may include a peroxide oxidizer and the non-aqueous solvent may be an organic solvent. In one example embodiment, the oxidizer 220 may be hydrogen peroxide ($H_2O_2$), and the non-aqueous solvent may be isopropyl alcohol (IPA). However, other oxidizers and solvents may also be used in the surface modification solution 215, as described in more detail below.

In the first embodiment shown in FIG. 2, the wet ALE process uses ultra-violet (UV) photolysis to create a reactant with a very short lifetime and very high oxidation potential to perform the surface oxidation. During the surface modification step 200, the surface of the substrate is exposed to UV radiation 230 to photolyze the oxidizer 220 and create oxidizing radicals 222, which react with the exposed surface of the molybdenum layer 205 to oxidize the molybdenum surface and form a molybdenum oxide passivation layer 225 (e.g., a molybdenum trioxide layer, $MoO_3$). When hydrogen peroxide is used as the oxidizer 220, for example, UV photolysis of the oxidizer 220 creates hydroxyl radicals, which oxidize the molybdenum surface and form the molybdenum oxide passivation layer. Because the lifetime of the oxidizing radicals 222 created through UV photolysis is relatively short, the use of oxidizing radicals 222 as an oxidizing reactant limits oxidation of the molybdenum surface to provide quasi-self-limiting oxidation behavior.

After the molybdenum oxide passivation layer 225 is formed in the surface modification step 200, the first purge step 240 is performed to remove the surface modification solution 215 from the surface of the substrate. In the first purge step 240, the substrate is rinsed with a first purge solution 245 to remove the surface modification solution 215 and excess reactants from the surface of the substrate. The first purge solution 245 should not react with the molybdenum oxide passivation layer 225 formed during the surface modification step 200, or with the reactants in the surface modification solution 215. In some embodiments, the first purge solution 245 may use the same solvent (e.g., IPA) used in the surface modification solution 215. However, other solvents may also be utilized, as discussed in more detail below. In some embodiments, the first purge step 240 may be long enough to completely remove all excess reactants from the substrate surface.

After the substrate is rinsed, the dissolution step 250 is performed to selectively remove the molybdenum oxide passivation layer 225 formed during the surface modification step 200. In the dissolution step 250, the substrate is exposed to a dissolution solution 255 to selectively remove or dissolve the molybdenum oxide passivation layer 225 without removing the unmodified molybdenum layer 205 underlying the molybdenum oxide passivation layer 225 or the dielectric material 210 surrounding the molybdenum layer 205. The dissolution solution 255 contains a reactive agent dissolved in an aqueous solvent. In some embodiments, the reactive agent may be an acid, such as hydrochloric acid (HCl), and the aqueous solvent may be deionized water (DI $H_2O$). Other reactive agents and solvents may also be utilized, as discussed in more detail below.

In order to selectively remove the molybdenum oxide passivation layer 225, the molybdenum oxide passivation layer 225 must be soluble, and the unmodified molybdenum layer 205 underlying the molybdenum oxide passivation layer 225 must be insoluble, in the dissolution solution 255. The solubility of the molybdenum oxide passivation layer 225 allows its removal through dissolution into the bulk dissolution solution 255. In some embodiments, the dissolution step 250 may continue until the molybdenum oxide passivation layer 225 is dissolved.

Once the molybdenum oxide passivation layer 225 is dissolved within the dissolution solution 255, the wet ALE etch cycle shown in FIG. 2 may be completed by performing a second purge step 260 to remove the dissolution solution 255 from the surface of the substrate. In the second purge step 260, the substrate is rinsed with a second purge solution 265, which may be the same or different than the first purge solution 245. In some embodiments, the second purge solution 265 may use the same solvent (e.g., IPA) used within the surface modification solution 215. However, other solvents may also be utilized, as discussed in more detail below. The second purge step 260 may generally continue until the dissolution solution 255 and/or the reactants and soluble species contained within the dissolution solution 255 are completely removed from the surface of the substrate.

Wet ALE of molybdenum requires the formation of a self-limiting passivation layer on the underlying unmodified molybdenum layer. This passivation layer must be insoluble in the first etch solution used for its formation (i.e., surface modification solution 215), but freely soluble in a second etch solution (i.e., dissolution solution 255) used for its dissolution. The self-limiting passivation layer must be removed every cycle after its formation. The second etch solution is used to selectively dissolve the passivation layer without etching the underlying unmodified molybdenum layer.

The formation of a passivation layer is accomplished in the wet ALE process shown in FIG. 2 by UV photolysis of a peroxide oxidizer (e.g., hydrogen peroxide, $H_2O_2$) to create oxidizing radicals 222, which react with the exposed surface of the molybdenum layer 205 to oxidize the molybdenum surface and form a molybdenum oxide passivation layer 225 (such as, e.g., $MoO_3$), which is quasi-self-limiting. Unlike oxidation of a molybdenum surface using hydrogen peroxide (and other peroxides), which is not self-liming, oxidation of a molybdenum surface using oxidizing radicals 222 created by UV photolysis of peroxides can be used to create a quasi-self-limiting molybdenum oxide passivation layer 225.

A wide variety of etch chemistries can be used within the surface modification and dissolution solutions shown in FIG. 2. In some embodiments, the surface modification solution 215 may include: (a) a peroxide oxidizer, such as hydrogen peroxide ($H_2O_2$), and (b) a non-aqueous organic solvent, such as methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. Other peroxide oxidizers and non-aqueous organic solvents may also be used within the surface modification solution 215. Instead of hydrogen peroxide, for example, the surface modification solution 215 could include symmetric organic peroxides (such as di-tert-butyl peroxide ($C_8H_{18}O_2$)), asymmetric organic peroxides (such as tert-butyl peroxybenzoate ($C_{11}H_{14}O_3$)), monoperoxides (such as tert-butyl hydroperoxide ($C_4H_{10}O_2$)), or peroxy acids (such as peroxyacetic acid, or peracetic acid, ($C_2H_4O_3$)).

A wide variety of oxidizing radicals 222 can be formed by UV photolysis of peroxides. As noted above, UV photolysis of hydrogen peroxide forms hydroxyl radicals. However, other peroxides will form other types of oxidizing radicals 222 when photolyzed. For example, UV organic peroxides will form alkoxy radicals (e.g., di-tert-butyl peroxide is photolyzed to tert-butoxy radicals) and peroxy acids will form both hydroxyl radicals and acidoxy radicals (e.g., peracetic acid will form hydroxyl and acetoxy radicals) when photolyzed. The oxidizing radicals 222 formed from any of these peroxides can be used to oxidize the molybdenum surface and create a quasi-self-limiting molybdenum oxide passivation layer 225.

The dissolution solution 255 may be an aqueous or non-aqueous dissolution solution. In some embodiments, for example, the dissolution solution 255 may include an acid, such as hydrochloric acid (HCl), nitric acid or sulfuric acid, and an aqueous solvent, such as deionized water (DI $H_2O$). In other embodiments, the dissolution solution 255 may include base, such as ammonium hydroxide ($NH_4OH$), tetramethylammonium hydroxide (TMAH), potassium hydroxide (KOH) or calcium hydroxide ($Ca(OH)_2$) dissolved in an aqueous solvent. Other acids and bases may also be used in the dissolution solution 255. In still further embodiments, the dissolution solution 255 may include a ligand dissolved in a non-aqueous solvent. Alpha-benzoin oxime is one example of a ligand that may be included within the dissolution solution 255. Alpha-benzoin oxime is soluble in alcohol, acetone, dimethyl sulfoxide (DMSO), methyl-ethyl ketone (MEK) and other ketones. The α-benzoin oxime ligand selectively binds to $Mo^{6+}$ ions, including the $MoO_3$ passivation layer, to form a Mo-α-benzoin oxime complex, which is soluble in acetone, DMSO, and other ketones, but not in alcohol or water. This chemical selectivity allows ligand binding and dissolution to be accomplished in a single non-aqueous solvent containing acetone, DMSO, and other ketones, for example.

Etching experiments were conducted on coupons cut from a 300 mm silicon wafer with various thicknesses of chemical vapor deposition (CVD) molybdenum deposited on one side to investigate the wet ALE process shown in FIG. 2. The etch recipe used to etch the molybdenum includes multiple wet ALE cycles, where each cycle includes a dip in various concentrations of hydrogen peroxide (e.g., 0.1-0.5% $H_2O_2$) dissolved in isopropyl alcohol (IPA), followed by an IPA rinse, a 10 second dip in an aqueous solution of 5 M HCl, and an IPA rinse and blow dry. The wet ALE process was repeated for a number of ALE cycles under different process conditions to investigate the etch rate produced by the wet ALE process shown in FIG. 2 with and without UV photolysis, and the effect that UV exposure had on etch rate as a function of oxidation time and $H_2O_2$ concentration.

Figure 3A:
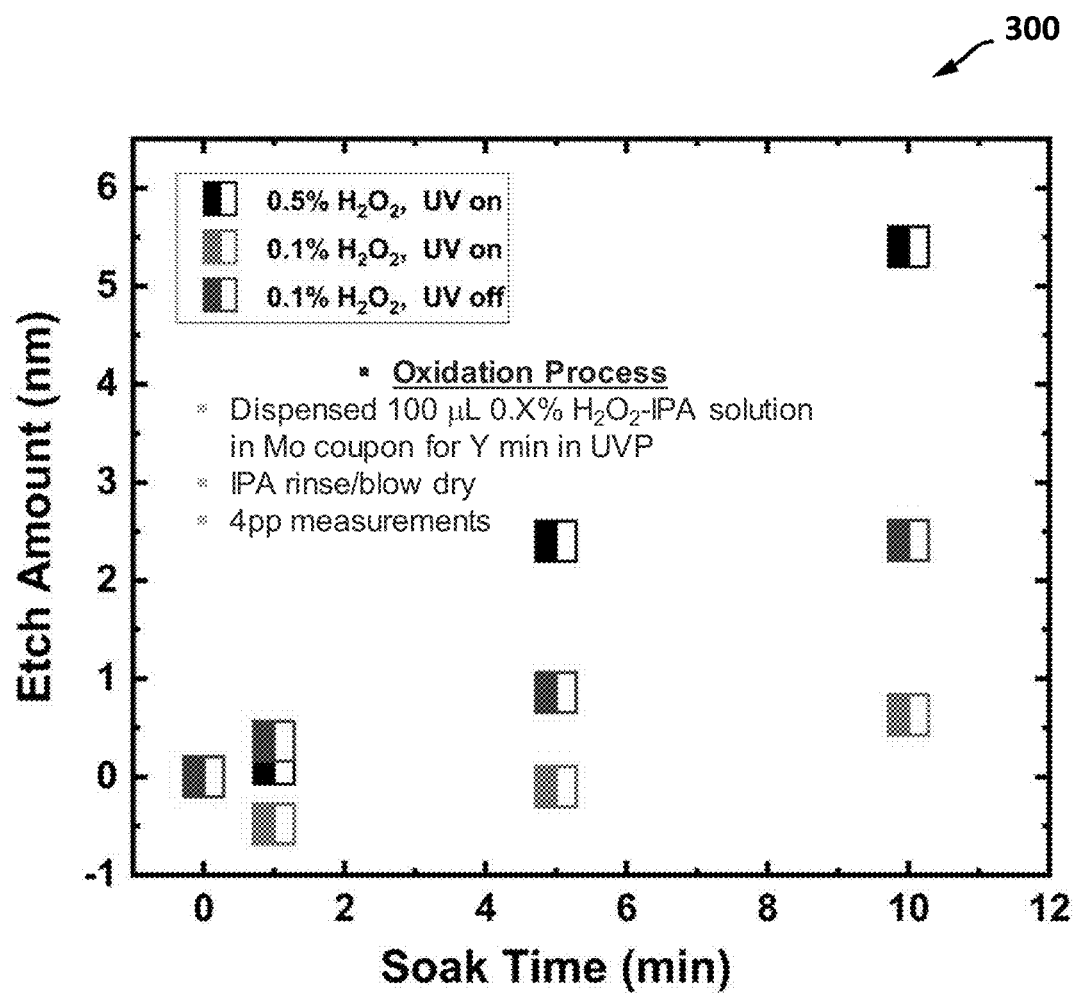
FIG. 3A is a graph depicting exemplary etch amounts (expressed in nanometers, nm) that may be achieved over time (expressed in minutes, min) when attempting to etch a molybdenum surface using various concentrations of a surface modification solution (e.g., hydrogen peroxide, $H_2O_2$) with and without UV photolysis.

The graph 300 shown in FIG. 3A depicts exemplary etch amounts (expressed in nanometers, nm) that were achieved over time (expressed in minutes, min) when attempting to etch a molybdenum (Mo) surface using various concentrations of hydrogen peroxide (e.g., 0.1% $H_2O_2$ and 0.5% $H_2O_2$) with and without UV exposure during the surface modification step 200. To obtain the results shown in the graph 300, the surface of the silicon wafer was exposed to 100 microliters (μL) of 0.1% and 0.5% $H_2O_2$ in IPA solution in the presence and absence of UV exposure for a variable length of time (e.g., 0-10 minutes) to oxidize the molybdenum surface and form a molybdenum oxide passivation layer. Specifically, the surface of the silicon wafer was exposed to 0.5% $H_2O_2$ in IPA solution in the presence of UV radiation (UV on), 0.1% $H_2O_2$ in IPA solution in the presence of UV radiation (UV on), 0.1% $H_2O_2$ in IPA solution in the absence of UV radiation (UV off) in three separate wet ALE processes. After performing the rinse and dissolution steps, and repeating each wet ALE process for a number of cycles, 4-point probe (4 pp) resistivity measurements were obtained to measure the etch amount achieved by the wet ALE processes.

Molybdenum oxides tend to be water soluble, but are not soluble in alcohols, such as IPA. In the graph 300 shown in FIG. 3A, the 0.1% $H_2O_2$ in IPA solution without UV radiation (UV off) results in a continuous etch of the molybdenum surface over the time period shown. This is because $H_2O_2$ can oxidize molybdenum oxides to molybdenum oxo-peroxides, which are alcohol soluble. However, the etch rate is dependent on $H_2O_2$ concentration when the $H_2O_2$ solution is exposed to UV radiation to break the peroxide bond in $H_2O_2$ and create hydroxyl radicals, which react with the molybdenum surface to form the molybdenum oxide passivation layer. As shown in FIG. 3A, UV photolysis of $H_2O_2$ increases the etch amount at higher $H_2O_2$ concentrations (e.g., 0.5% $H_2O_2$ in IPA solution), but suppresses the etch amount at lower $H_2O_2$ concentrations (e.g., 0.1% $H_2O_2$ in IPA solution).

Figure 3B:
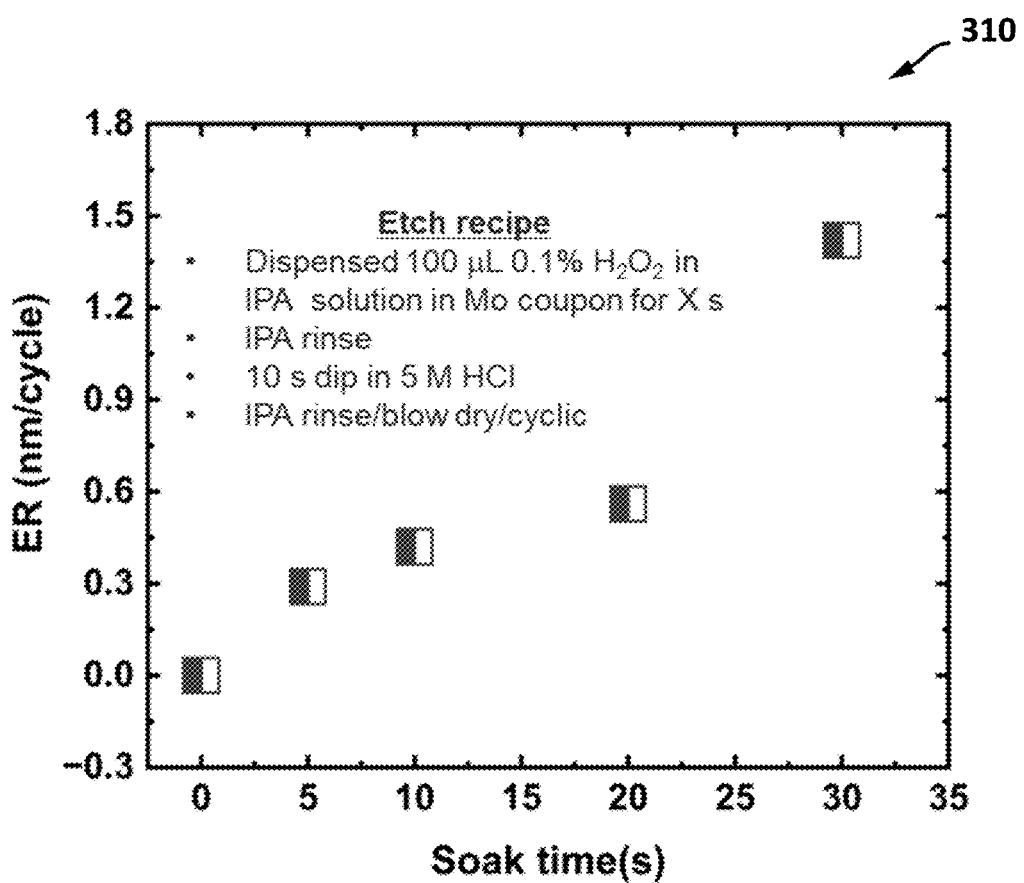
FIG. 3B is a graph depicting exemplary etch amounts (nm) achieved as a function of oxidation time (expressed in seconds, s) when using UV photolysis of $H_2O_2$ to oxidize the molybdenum surface in the wet ALE process shown in FIG. 2.

The graph 310 shown in FIG. 3B depicts exemplary etch amounts (nm) achieved as a function of oxidation time (expressed in seconds, s) when using UV photolysis of $H_2O_2$ to oxidize the molybdenum surface in the wet ALE process shown in FIG. 2. The graph 310 shows that the wet ALE process shown in FIG. 2 is quasi-self-limiting for short oxidation times (e.g., 0-20 seconds), while longer oxidation times (e.g., greater than 20 seconds) lose the advantages of UV photolysis.

Figure 3C:
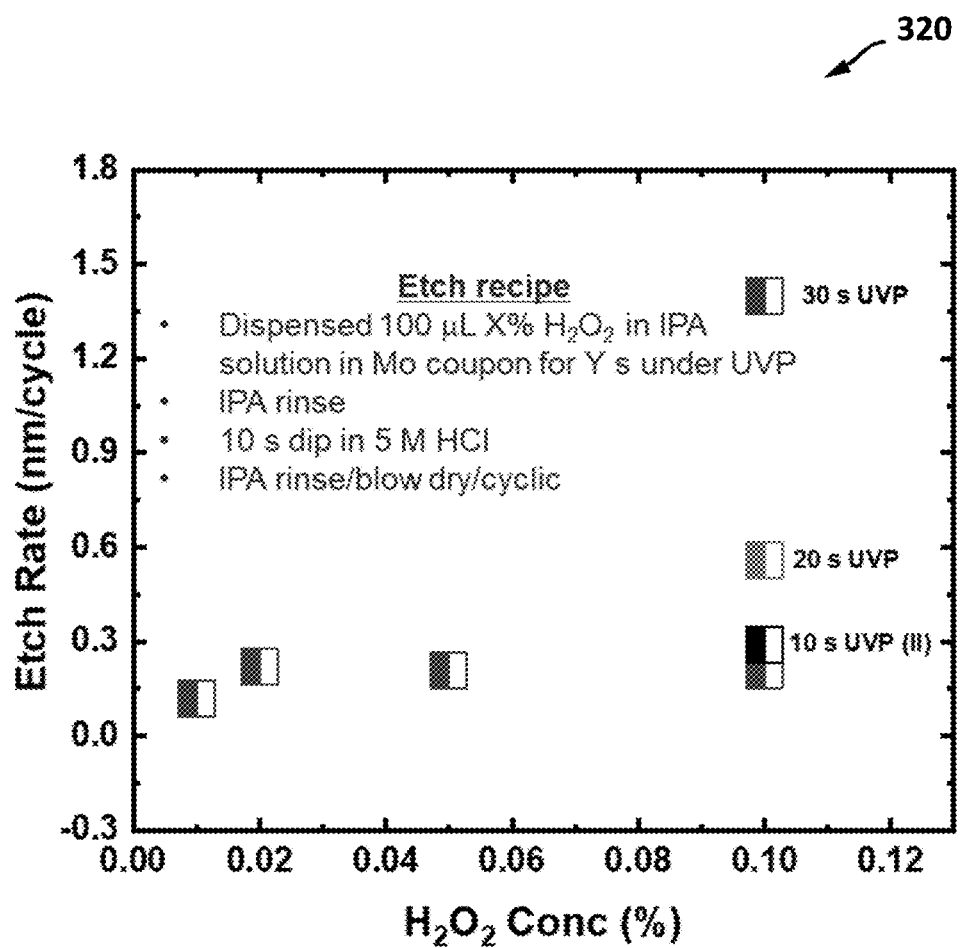
FIG. 3C is a graph depicting exemplary etch amounts (nm) achieved as a function of $H_2O_2$ concentration (expressed in %) when using UV photolysis of $H_2O_2$ to oxidize the molybdenum surface in the wet ALE process shown in FIG. 2.

The graph 320 shown in FIG. 3C depicts exemplary etch amounts (nm) achieved as a function of $H_2O_2$ concentration when using UV photolysis of $H_2O_2$ to oxidize the molybdenum surface in the wet ALE process shown in FIG. 2. The graph 320 shows that the oxidation rate is independent of $H_2O_2$ concentration, indicating another species (e.g., the hydroxyl radicals 222) is driving the oxidation.

Figure 4:
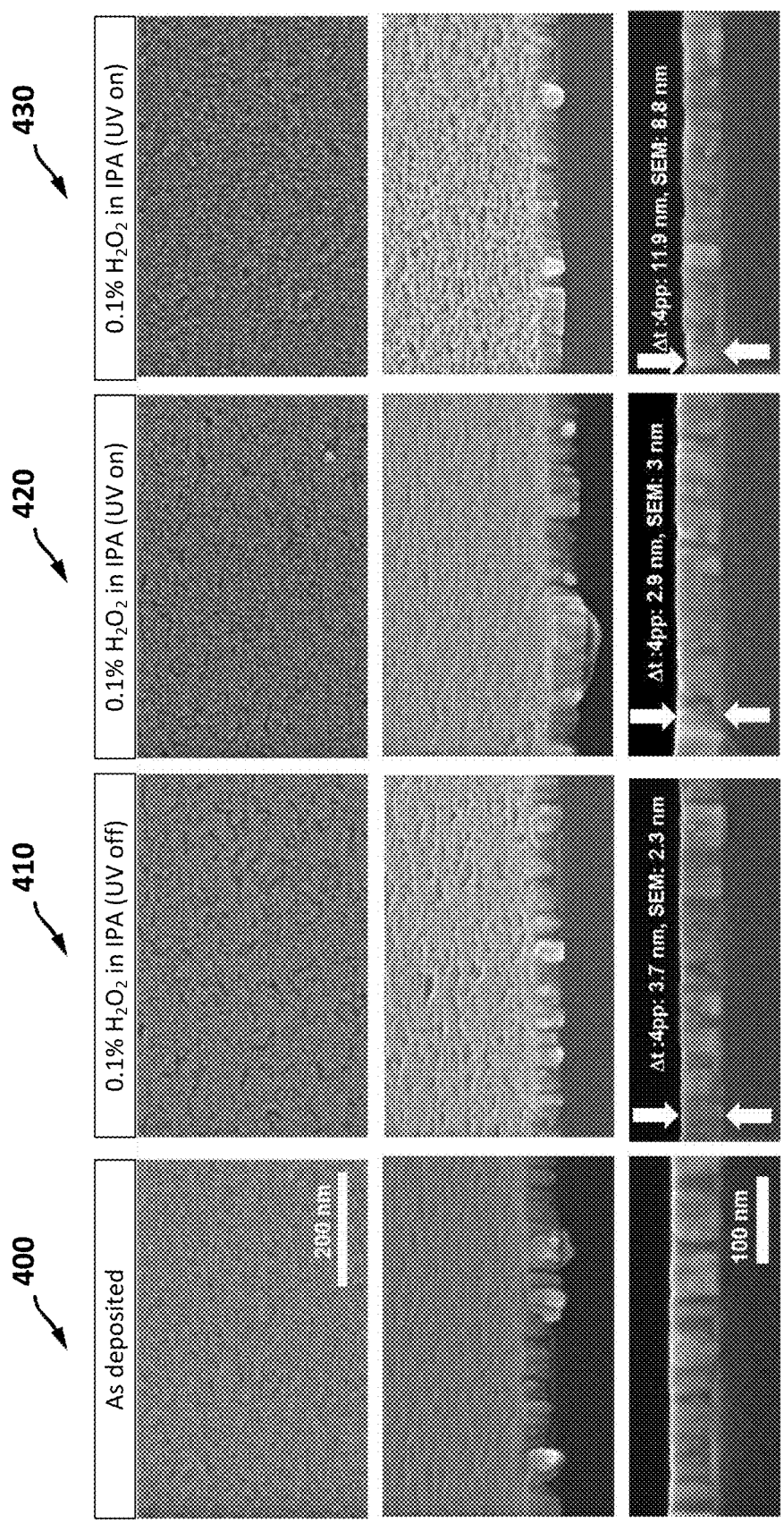
FIG. 4 provides scanning electron microscope (SEM) images depicting as-deposited molybdenum and post-etch molybdenum for various etch conditions used in the wet ALE process shown in FIG. 2.

The wet ALE process shown in FIG. 2 causes a minimal increase in the surface roughness of the post-etched surface. To observe the etched surface, top down and tilt view scanning electron microscope (SEM) images of as-deposited molybdenum (400) and post-etch molybdenum (410, 420, 430) were obtained for various etch conditions, as shown in FIG. 4. In the post-etch SEM images (410, 420 and 430), the etch amount was calculated from 4-point probe (4 pp) resistivity measurements of the molybdenum film and the etch amount measured by SEM cross section are in good agreement.

There are three sets of post-etch SEM images illustrated in FIG. 4. In the first set of post-etch SEM images 410, a coupon was etched using 0.1% $H_2O_2$ in IPA solution in the absence of UV radiation (UV off). Using this etch solution resulted in approximately 3.7 nm of etching after 15 cycles. The second set of post-etch SEM images 420 shows a coupon etched using 0.1% $H_2O_2$ in IPA solution in the presence of UV radiation (UV on). This coupon was etched approximately 2.9 nm after 25 cycles. The third set of post-etch SEM images 430 shows a coupon etched using 0.1% $H_2O_2$ in IPA solution in the presence of UV radiation (UV on). This coupon was etched approximately 11.9 nm after 50 cycles. The post-etch SEM images 410, 420 and 430 show that the post-etch surface of the molybdenum film is better (e.g., smoother) after UV illumination for small etch amounts (as shown in the comparison between images 410 and 420), but worse with increasing etch amounts (as shown in the image 430).

The wet ALE process shown in FIG. 2 provides new wet etch chemistries and techniques for etching molybdenum. In the wet ALE process shown in FIG. 2, UV photolysis of peroxide oxidizers is used to stabilize the molybdenum oxide passivation layer (by using short lifetime hydroxyl radicals to limit the oxidation of the molybdenum surface) and provide quasi-self-limiting oxidation behavior in the surface modification step. In some embodiments, the oxidation behavior may be further improved by utilizing additional or alternative oxidation techniques, such as by using non-peroxide oxidizers in the surface modification step 200.

Steric Hinderance of Oxidizers

Figure 5:
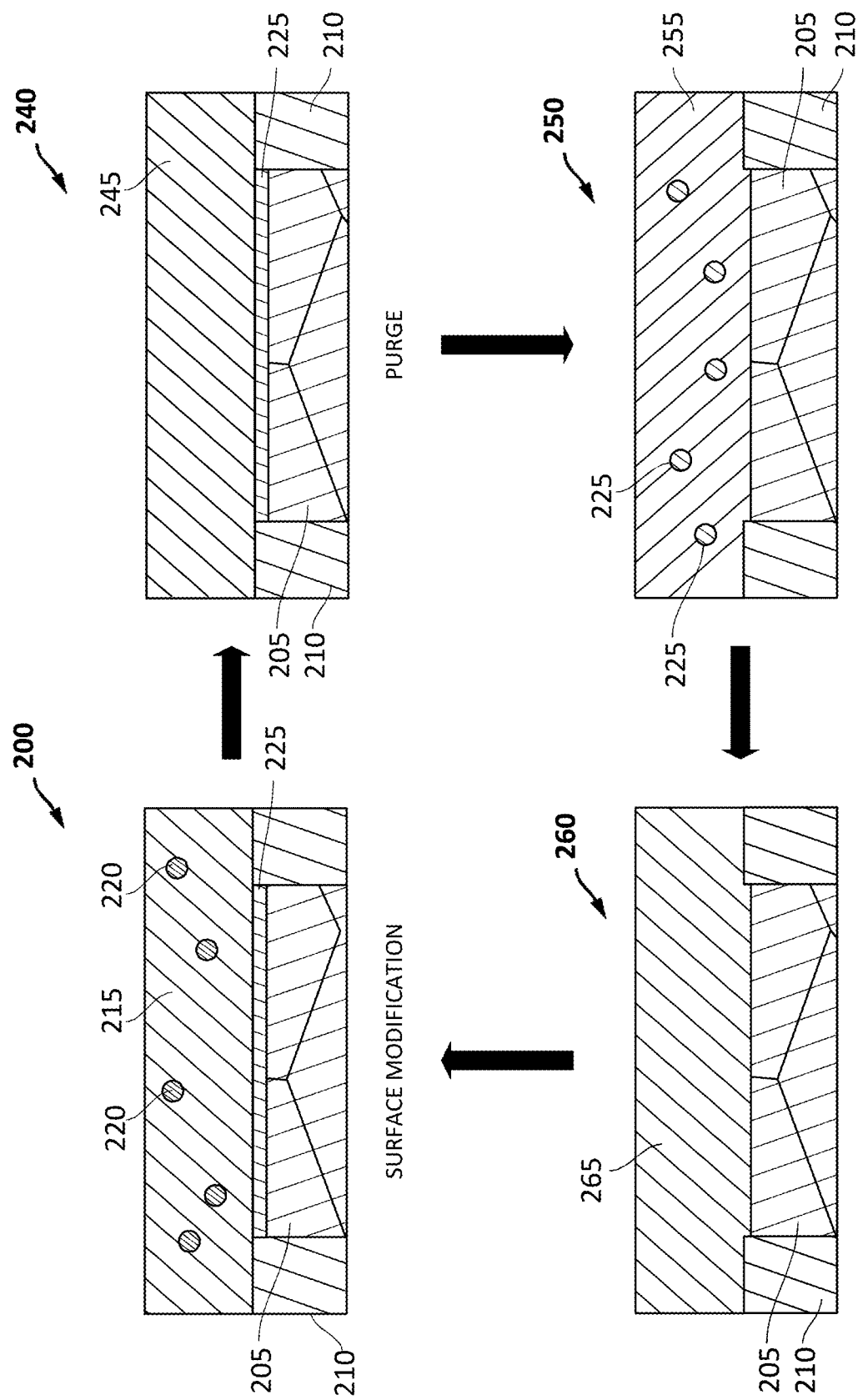
FIG. 5 illustrates another example of a cyclic wet ALE process that can be used to etch a transition metal surface, such as a molybdenum surface, in accordance with a second embodiment of the present disclosure.

FIG. 5 illustrates another example of a wet ALE process that can be used to etch molybdenum in accordance with a second embodiment of the present disclosure. Like the previous embodiment shown in FIG. 2, the wet ALE process shown in FIG. 5 is a cyclical process consisting of one or more ALE cycles, where each ALE cycle includes a surface modification step 200, a first purge step 240, a dissolution step 250 and a second purge step 260.

During the surface modification step 200, the surface of the substrate is exposed to a surface modification solution 215 in the wet ALE process shown in FIG. 5 to oxidize the surface of the molybdenum layer 205 and form the molybdenum oxide passivation layer 225. Like the previous embodiment shown in FIG. 2, the surface modification solution 215 used in the wet ALE process shown in FIG. 5 contains an oxidizer 220 dissolved in a non-aqueous solvent. Unlike the previous embodiment, however, the oxidizer 220 used in FIG. 5 includes an oxidizer having a substantially larger reactant molecule.

In one example embodiment, the oxidizer 220 used in FIG. 5 is ammonium persulfate (APS), and the non-aqueous solvent is an organic solvent, such as methanol ($CH_3OH$). APS dissolved in methanol oxidizes the surface of the molybdenum layer 205 to form a molybdenum oxide passivation layer, such as molybdenum trioxide ($MoO_3$). In another example embodiment, the oxidizer 220 used in FIG. 5 is ferric chloride ($FeCl_3$), and the non-aqueous solvent is an organic solvent, such as isopropyl alcohol (IPA) or acetone ($C_3H_6O$). Ferric chloride dissolved in IPA or acetone oxidizes the surface of the molybdenum layer 205. The presence of halogens in this oxidizing agent allows for their incorporation in the oxidized surface layer with molybdenum chloride (e.g., $MoCl_x$) or molybdenum oxychloride (e.g., $MoO_yCl_{(x-2y)}$) passivation layer formation being possible. However, other oxidizers and solvents may also be utilized, as described in more detail below In the second embodiment shown in FIG. 5, the wet ALE process uses steric hinderance of oxidizers to achieve better self-limiting oxidation behavior than the wet ALE process shown in FIG. 2. More specifically, the wet ALE process shown in FIG. 5 may use an oxidizer 220 having a relatively large reactant molecule. As described in more detail below, using an oxidizer 220 with a large reactant molecule improves self-limiting behavior by reducing the oxidation rate of the molybdenum surface during the surface modification step 200.

In some embodiments, the wet ALE process shown in FIG. 5 may use a non-peroxide oxidizer in the surface modification solution 215 instead of the peroxide oxidizer used in the wet ALE process shown in FIG. 2. The non-peroxide oxidizer has a substantially larger reactant molecule than many of the peroxide oxidizers listed above, including hydrogen peroxide ($H_2O_2$). In some embodiments, the relative difference between "larger" and "smaller" reactant molecules may be quantified by comparing the molecular size of the reactant molecule in the non-peroxide oxidizer with the molecular size of the reactant molecule in hydrogen peroxide. For example, the hydroxide radical in hydrogen peroxide ($H_2O_2$) has a bond length of approximately 1.0 angstroms (Å) and a radical length of approximately 1.5 angstroms (Å). In comparison, the oxidizing radical (or reactant molecule) in the non-peroxide oxidizer used in FIG. 5 may have a substantially greater radical length than that of the hydroxide radical. For example, the oxidizing radical in the non-peroxide oxidizer may have a radical length that is substantially greater than 2 angstroms (Å), or a radical length of at least twice the size of the hydroxide radical, in some embodiments.

As noted above, ammonium persulfate (APS) and ferric chloride ($FeCl_3$) are examples of non-peroxide oxidizers that can be used as the oxidizer 220 in the embodiment shown in FIG. 5. The reactant molecule in APS is the sulfate radical ($SO_4^-$), which has a bond length of 1.5 angstroms (Å) and a radical length of approximately 3.6 angstroms (Å). Compared to the hydroxide radical in hydrogen peroxide, the sulfate radical in APS is roughly 2.4 times larger than the hydroxide radical. When ferric chloride ($FeCl_3$) is used as the oxidizer 220, the reactant molecule in the non-peroxide oxidizer has a bond length of 2.3 angstroms (Å), and thus, an even greater radical length than the hydroxide radical.

In addition to non-peroxide oxidizers (such as APS and $FeCl_3$), other oxidizers having a substantially larger reactant module (e.g., a reactant molecule have a molecular size, or radical length, substantially greater than 2 Å) may also be used in the surface modification solution 215 shown in FIG. 5. For example, symmetric organic peroxides (such as di-tert-butyl peroxide ($C_8H_{18}O_2$)) and asymmetric organic peroxides (such as tert-butyl peroxybenzoate ($C_{11}H_{14}O_3$)) can be used to achieve better self-limiting oxidation behavior by leveraging steric hinderance.

After the surface modification step 200 shown in FIG. 5 is performed to form a molybdenum oxide passivation layer 225 (e.g., a $MoO_3$ or $MoO_yCl_{(x-2y)}$ passivation layer) on the underlying molybdenum layer 205, the first purge step 240 is performed to remove the surface modification solution 215 and excess reactants from the surface of the substrate. In some embodiments, the first purge solution 245 may use the same solvent (e.g., methanol, IPA or acetone) used in the surface modification solution 215. However, other solvents may also be utilized, as discussed in more detail below. As noted above, the first purge step 240 may be long enough to completely remove all excess reactants from the substrate surface.

After the substrate is rinsed, dissolution step 250 is performed to selectively remove the molybdenum oxide passivation layer 225 formed during the surface modification step 200. In the dissolution step 250, the substrate is exposed to dissolution solution 255 to selectively remove or dissolve the molybdenum oxide passivation layer 225 without removing the unmodified molybdenum layer 205 underlying the molybdenum oxide passivation layer 225 or the dielectric material 210 surrounding the molybdenum layer 205. The dissolution solution 255 contains a reactive agent dissolved in an aqueous or non-aqueous solvent. In some embodiments, the dissolution solution 255 may include hydrochloric acid (HCl) in deionized water (DI $H_2O$) or α-benzoin oxime in acetone when the surface modification solution 215 includes ammonium persulfate (APS). In other embodiments, the dissolution solution 255 may include methanol or water when the surface modification solution 215 includes ferric chloride ($FeCl_3$). Other reactive agents and solvents may also be utilized, as discussed in more detail below.

After the molybdenum oxide passivation layer 225 is dissolved within the dissolution solution 255, the wet ALE etch cycle shown in FIG. 5 may be completed by performing the second purge step 260 to remove the dissolution solution 255 from the surface of the substrate. In the second purge step 260, the substrate is rinsed with a second purge solution 265, which may be the same or different than the first purge solution 245. In some embodiments, the second purge solution 265 may use the same solvent (e.g., methanol, IPA or acetone) used within the surface modification solution 215. However, other solvents may also be utilized, as discussed in more detail below. The second purge step 260 may generally continue until the dissolution solution 255 and/or the reactants and soluble species contained within the dissolution solution 255 are completely removed from the surface of the substrate.

The formation of a passivation layer is accomplished in the wet ALE process shown in FIG. 5 by using the steric hinderance of a larger sized oxidizer (e.g., APS, $FeCl_3$ and organic peroxides) to prevent the continuous etch process that occurs with oxidizers having smaller reactant molecules (such as, e.g., hydrogen peroxide and other peroxides). A larger reactant molecule (e.g., a reactant molecule having a molecular size, or radical length, substantially greater than 2 Å) has a smaller diffusion coefficient than a smaller reactant molecule (e.g., a reactant molecule having a molecular size, or radical length, less than 2 Å). This will result in a slower sub-surface oxidation rate, but also a slower unwanted continuous dissolution rate during the formation of the passivation layer. Thus, by switching from hydrogen peroxide (a smaller reactant molecule) to ammonium persulfate (a larger reactant molecule), the wet ALE process shown in FIG. 5 improves the self-limiting behavior of the molybdenum oxide passivation layer 225 by reducing the oxidation rate of the molybdenum surface during the surface modification step 200. While ammonium persulfate improves self-limiting behavior, other non-peroxide oxidizers may be used to ensure self-limiting oxidation behavior. For example, using ferric chloride dissolved in IPA or acetone as the oxidizer 220 ensures self-limiting oxidization behavior by forming a molybdenum chloride (e.g., $MoCl_x$) or a molybdenum oxychloride (e.g., $MoO_yCl_{(x-2y)}$) passivation layer, which is strictly self-limiting and insoluble in the non-aqueous solvent (IPA or acetone) used in the surface modification solution 215.

A wide variety of etch chemistries can be used within the surface modification and dissolution solutions shown in FIG. 5. In some embodiments, the surface modification solution 215 may include: (a) a non-peroxide oxidizer or a peroxide oxidizer having a relatively large reactant molecule and (b) a non-aqueous organic solvent. Examples of non-peroxide oxidizers that can be used in the surface modification solution 215 shown in FIG. 5 include, but are not limited to, ammonium persulfate (APS), ferric chloride ($FeCl_3$), osmium tetroxide, ruthenium tetroxide, ruthenates, manganates, permanganates, periodates (and other halide oxyanions), and metal nitrates (such as, e.g., ceric ammonium nitrate). Examples of peroxide oxidizers having large reactant molecules include organic peroxides, such as di-tert-butyl peroxide ($C_8H_{18}O_2$)) and tert-butyl peroxybenzoate ($C_{11}H_{14}O_3$). Examples of non-aqueous organic solvents include methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. Other oxidizers and non-aqueous organic solvents may also be used within the surface modification solution 215.

Similar to the wet ALE process shown in FIG. 2, the dissolution solution 255 used in the wet ALE process shown in FIG. 5 may be an aqueous acidic solution (containing, e.g., HCl, nitric acid or sulfuric acid), an aqueous basic solution (containing, e.g., $NH_4OH$, TMAH, KOH or $Ca(OH)_2$) or a non-aqueous ligand solution (containing, e.g., alpha-benzoin oxime in acetone, DMSO, MEK or other ketones). The choice of dissolution solution 255 may generally depend on the particular oxidizer used in the surface modification solution 215. In some embodiments, for example, the dissolution solution 255 may include an aqueous hydrochloric acid (HCl) solution, or α-benzoin oxime dissolved in acetone, when ammonium persulfate (APS) is used as the non-peroxide oxidizer. In other embodiments, the dissolution solution 255 may include methanol or deionized water when ferric chloride ($FeCl_3$) is used as the non-peroxide oxidizer. Other reactive agents may also be used in the dissolution solution 255 to selectively dissolve the molybdenum oxide passivation layer 225.

Etching experiments were conducted on coupons cut from a 300 mm silicon wafer with various thicknesses of chemical vapor deposition (CVD) molybdenum deposited on one side to investigate the wet ALE process shown in FIG. 5 when ammonium persulfate (APS) is used as the oxidizer 220. The etch recipe used to etch the molybdenum includes multiple wet ALE cycles, where each cycle includes a dip in various surface modification solutions (containing, e.g., various concentrations of APS and $H_2O_2$), followed by a methanol rinse, a 10 second dip in an aqueous solution of 5 M HCl, and a methanol rinse and blow dry. The wet ALE process was repeated for a number of ALE cycles under different process conditions to investigate the etch rate produced by larger (APS) and smaller ($H_2O_2$) reactant molecules, and the effect that APS had on etch rate as a function of oxidation time and cycle number.

Figure 6A:
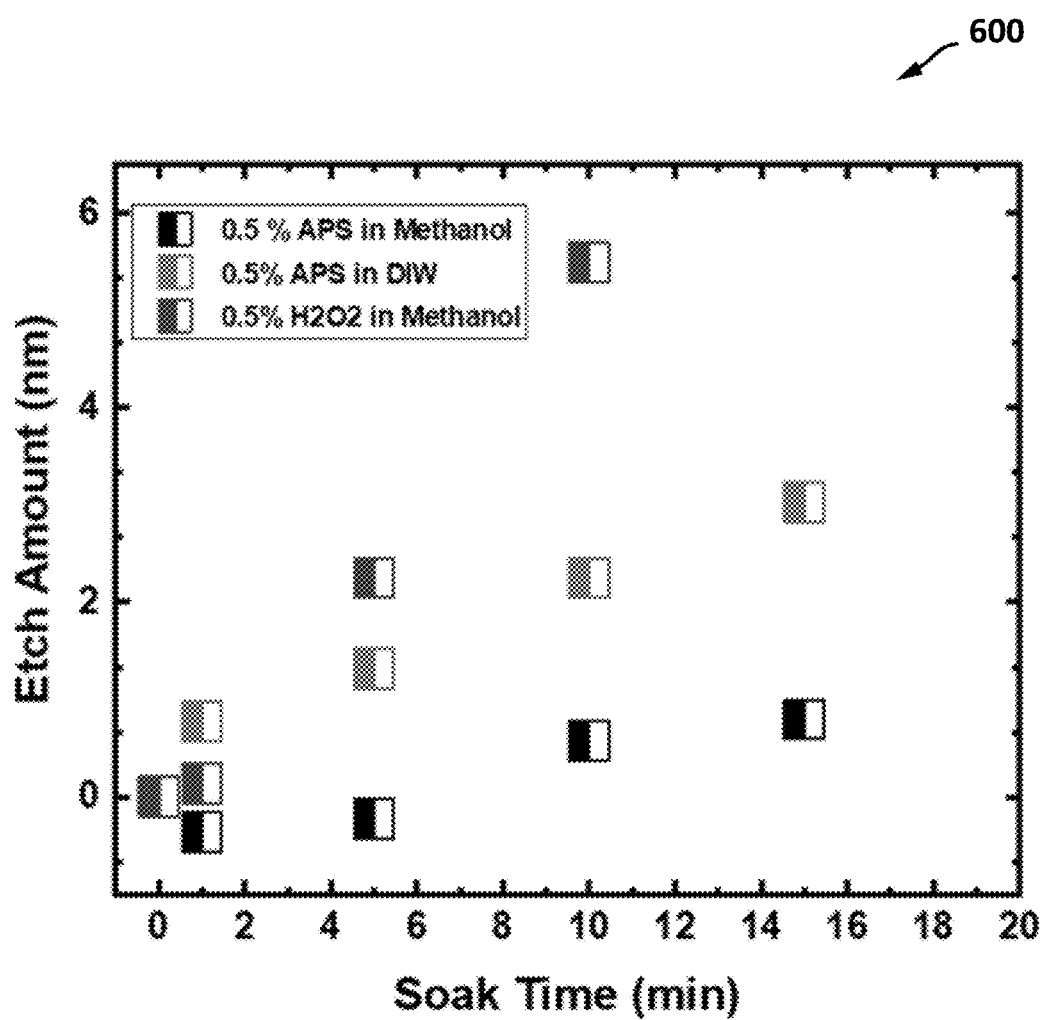
FIG. 6A is a graph depicting exemplary etch amounts (expressed in nm) achieved as a function of oxidation time (expressed in minutes, min) when using various non-peroxide oxidizers (e.g., ammonium persulphate, APS) and $H_2O_2$ to oxidize the molybdenum surface in the wet ALE process shown in FIG. 5.

The graph 600 shown in FIG. 6A depicts exemplary etch amounts (expressed in nm) achieved as a function of oxidation time (expressed in minutes, min) when using various surface modification solutions to oxidize the molybdenum surface in the wet ALE process shown in FIG. 5. To obtain the results shown in the graph 600, the surface of the silicon wafer was exposed to 0.5% APS in methanol, 0.5% APS in DIW and 0.5% $H_2O_2$ in methanol solution for variable lengths of time (e.g., 0-15 minutes) to oxidize the molybdenum surface and form a molybdenum oxide passivation layer in three separate wet ALE processes. The graph 600 shows that, while the 0.5% $H_2O_2$ in methanol solution produces a continuous etch of the molybdenum surface, the use of APS as an oxidizer significantly decreases the etch amount, compared to $H_2O_2$. The graph 600 further shows that the 0.5% APS in methanol (non-aqueous solution) provides a slower etch process than the 0.5% APS in DIW (aqueous solution).

Figure 6B:
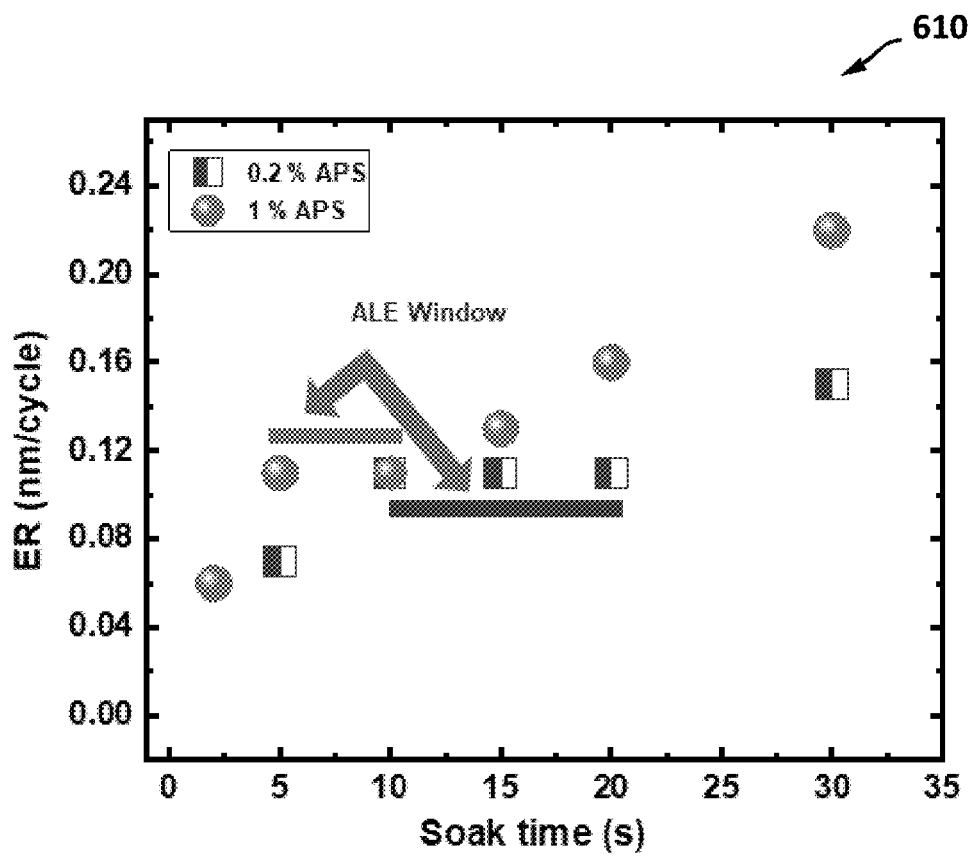
FIG. 6B is a graph depicting exemplary etch amounts (expressed in nm) achieved as a function of oxidation time (expressed in seconds, s) when using various concentrations of APS to oxidize the molybdenum surface in the wet ALE process shown in FIG. 5.

The graph 610 shown in FIG. 6B depicts exemplary etch amounts (expressed in nm) achieved as a function of oxidation time (expressed in seconds, s) when using various concentrations of APS (e.g., 0.2% APS and 1% APS) to oxidize the molybdenum surface in the wet ALE process shown in FIG. 5. The graph 610 shows that the ALE window (e.g., approximately 10 seconds) after 0.2% APS oxidation is larger than the ALE window (e.g., approximately 5 seconds) after 1% APS oxidation. The higher APS concentration (1% APS) saturates the molybdenum surface faster, resulting in a smaller ALE window than the lower APS concentration (0.2% APS). A continuous etch process past the ALE window suggests multiple oxidation steps are possible.

Figure 6C:
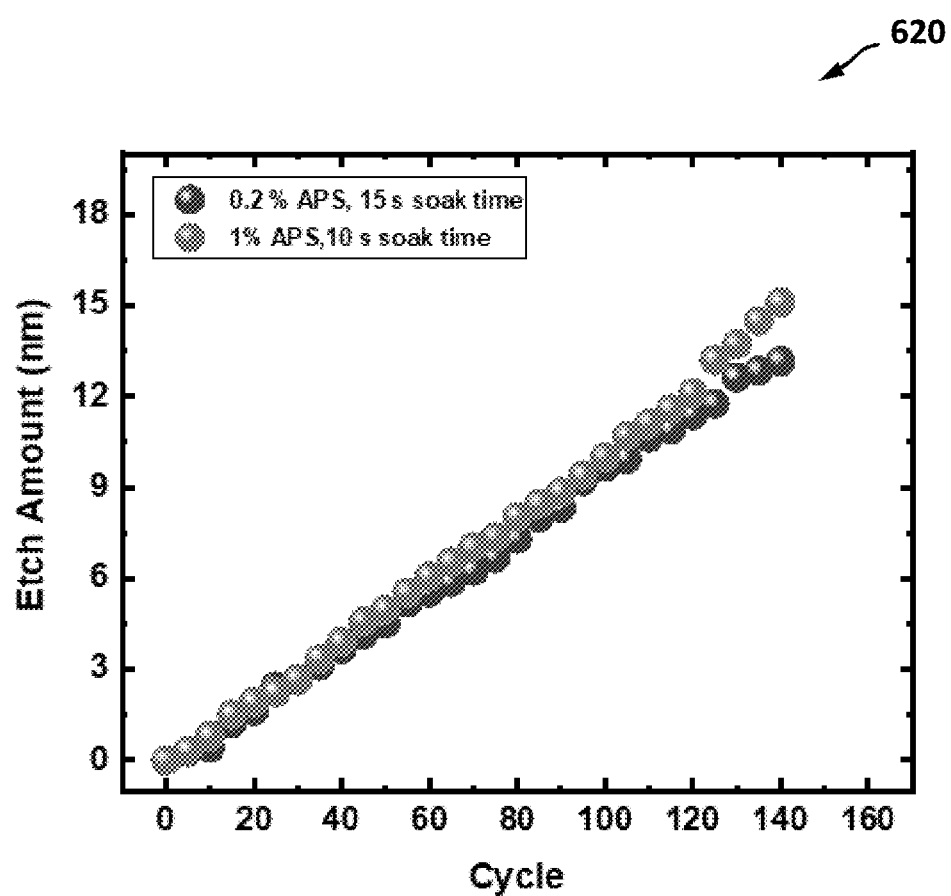
FIG. 6C is a graph depicting exemplary etch amounts (expressed in nm) achieved as a function of cycle number when using various concentrations of APS to oxidize the molybdenum surface in the wet ALE process shown in FIG. 5.

The graph 620 shown in FIG. 6C depicts exemplary etch amounts (expressed in nm) achieved as a function of ALE cycle number when using various concentrations of APS (e.g., 0.2% APS and 1% APS) to oxidize the molybdenum surface in the wet ALE process shown in FIG. 5. The graph 620 shows that the etch amount varies linearly with ALE cycle number and is independent of APS concentration within the ALE window.

Figure 7:
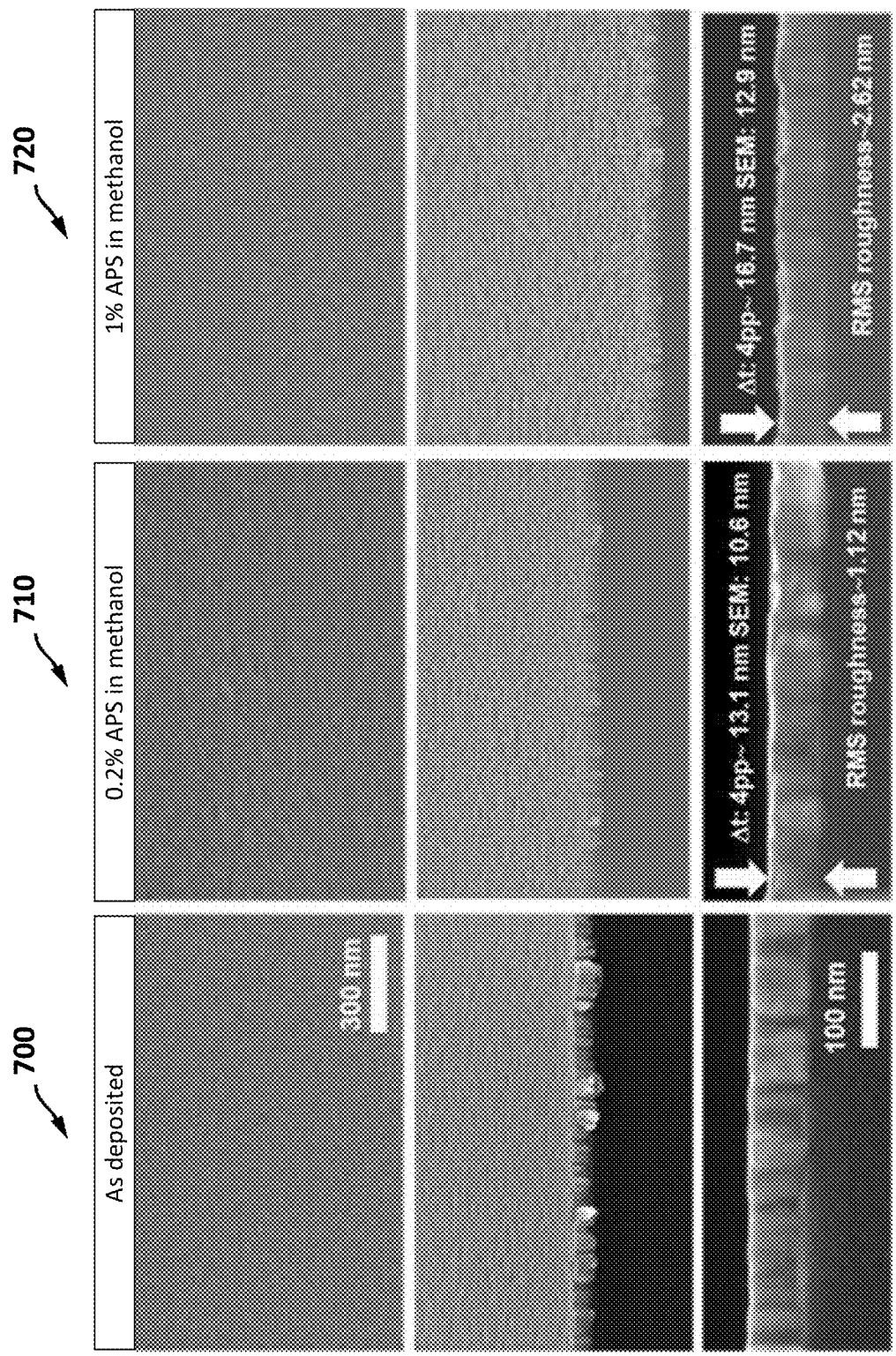
FIG. 7 provides SEM images depicting as-deposited molybdenum and post-etch molybdenum for various etch conditions used in the wet ALE process shown in FIG. 5 when ammonium persulphate (APS) is used as the oxidizer.

FIG. 7 provides SEM images depicting as-deposited molybdenum (700) and post-etch molybdenum (710, 720) for various etch conditions used in the wet ALE process shown in FIG. 5. There are two sets of post-etch SEM images illustrated in FIG. 7. In the first set of post-etch SEM images 710, a coupon was etched using 0.2% APS in methanol as the surface modification solution. This etch solution resulted in approximately 13.1 nm of etching after 145 cycles. The second set of post-etch SEM images 720 shows a coupon etched using 1% APS in methanol as the surface modification solution. This coupon was etched approximately 16.7 nm after 145 cycles. The post-etch SEM images 710 and 720 show that, while post-etch surface roughness increases for both oxidizing solutions, the 1% APS in methanol solution produces a rougher post-etch surface (RMS roughness approximately 2.62 nm) than the 0.2% APS in methanol solution (RMS roughness approximately 1.12 nm). The lower RMS roughness produced with the 0.2% APS methanol solution can be attributed to preventing continuous molybdenum etch off the coupon.

Additional etching experiments were conducted on coupons cut from a 300 mm silicon wafer with various thicknesses of chemical vapor deposition (CVD) molybdenum deposited on one side to investigate the wet ALE process shown in FIG. 5 when ferric chloride ($FeCl_3$) is used as the oxidizer 220. The etch recipe used to etch the molybdenum includes multiple wet ALE cycles, where each cycle includes a dip in various surface modification solutions (containing, e.g., various concentrations of $FeCl_3$ in deionized water, methanol, IPA and acetone), followed by an IPA rinse, a dip in deionized water, and an IPA rinse and blow dry. The wet ALE process was repeated for a number of ALE cycles under different process conditions to investigate the etch rate produced when ferric chloride is dissolvent in various solvents, and the effect that ferric chloride had on etch rate as a function of oxidation time and dissolution time.

Figure 8A:
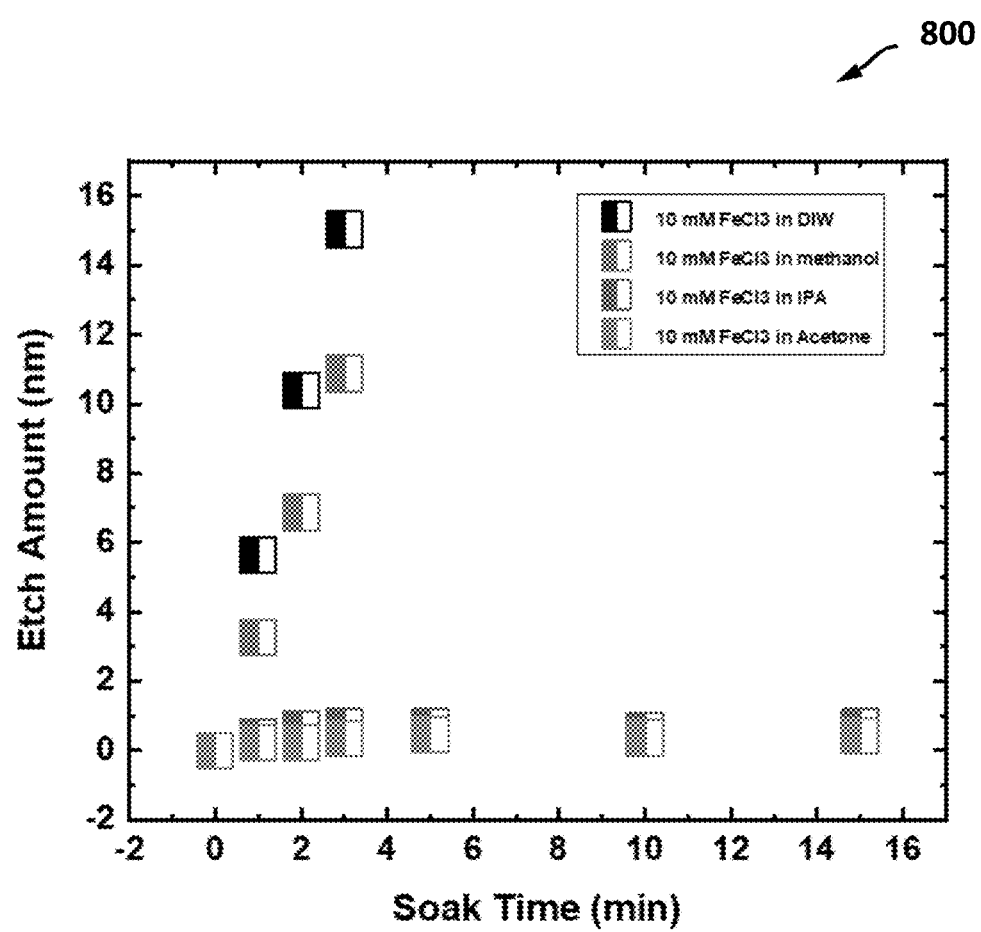
FIG. 8A is a graph depicting exemplary etch amounts (expressed in nm) achieved as a function of oxidation time (expressed in minutes, min) when using ferric chloride ($FeCl_3$) dissolved in various solvents (e.g., deionized water (DIW), methanol, isopropyl alcohol (IPA) and acetone) to oxidize the molybdenum surface in the wet ALE process shown in FIG. 5.

The graph 800 shown in FIG. 8A depicts exemplary etch amounts (expressed in nm) achieved as a function of oxidation time (expressed minutes, min) when using ferric chloride ($FeCl_3$) dissolved in various solvents (e.g., DIW, methanol, IPA and acetone) to oxidize the molybdenum surface in the wet ALE process shown in FIG. 5. The graph 800 shows that oxidation of the molybdenum surface is self-limiting when $FeCl_3$ dissolved in IPA or $FeCl_3$ dissolved in acetone is used as the oxidizer 220.

Figure 8B:
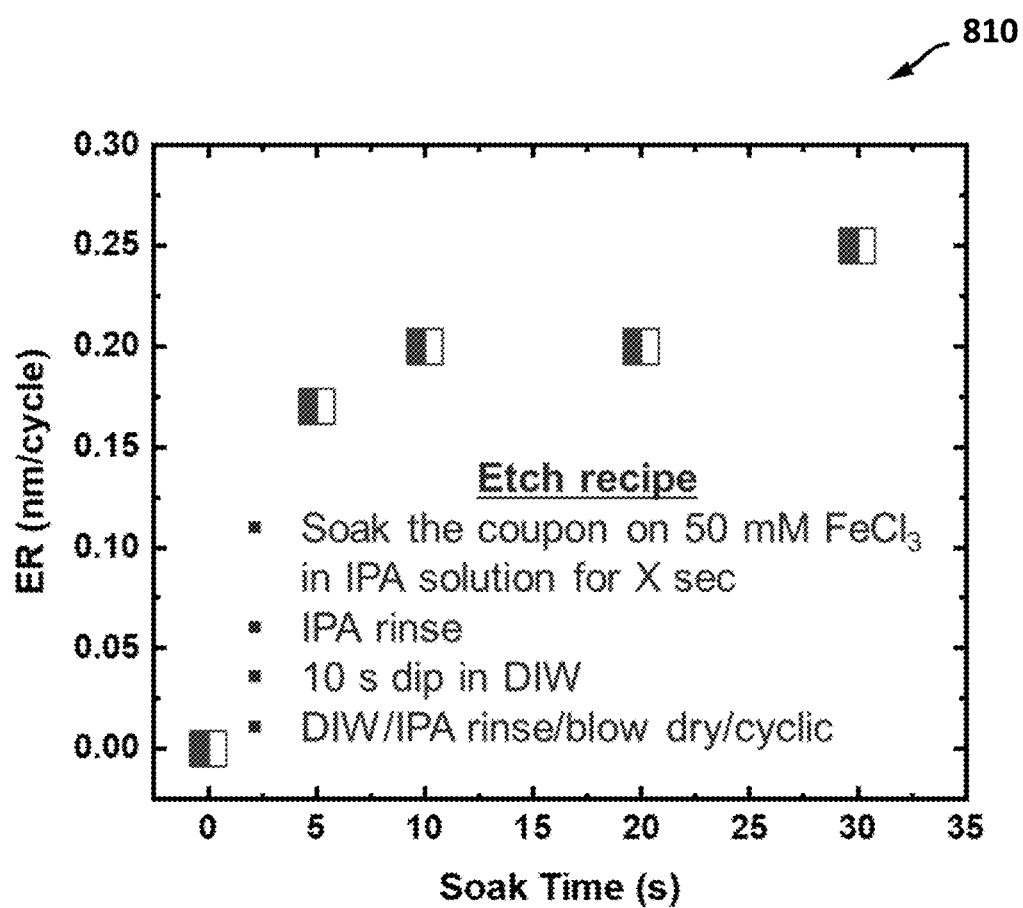
FIG. 8B is a graph depicting exemplary etch amounts (expressed in nm) achieved as a function of oxidation time (expressed in seconds, s) when using 50 mM $FeCl_3$ dissolved in IPA to oxidize the molybdenum surface, and a dissolution solution comprising DIW to etch the oxidized molybdenum surface in the wet ALE process shown in FIG. 5.

The graph 810 shown in FIG. 8B depicts exemplary etch amounts (expressed in nm) achieved as a function of oxidation time (expressed in seconds, s) when using a surface modification solution comprising 50 mM $FeCl_3$ dissolved in IPA to oxidize the molybdenum surface, and a dissolution solution comprising deionized water (DIW) to etch the oxidized molybdenum surface in the wet ALE process shown in FIG. 5. In the graph 810, a molybdenum etch rate of approximately 0.2 nm/cycle was achieved with oxidation times ranging between 10-20 seconds, indicating that oxidation of the molybdenum surface to form the molybdenum oxide passivation layer 225 (e.g., $MoO_yCl_{(x-2y)}$) is self-limiting during these oxidation times.

Figure 8C:
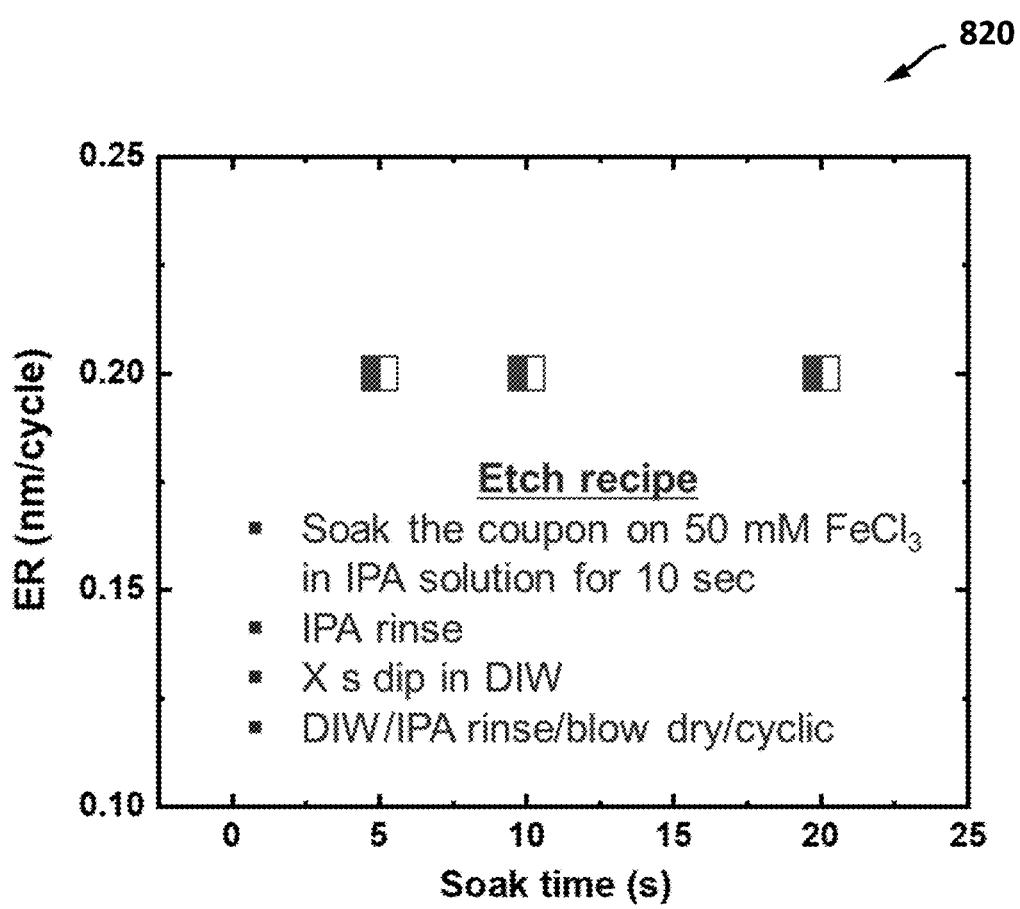
FIG. 8C is a graph depicting exemplary etch amounts (expressed in nm) achieved as a function of dissolution time (expressed in seconds, s) when using 50 mM $FeCl_3$ dissolved in IPA to oxidize the molybdenum surface, and a dissolution solution comprising DIW to etch the oxidized molybdenum surface in the wet ALE process shown in FIG. 5.

The graph 820 shown in FIG. 8C depicts exemplary etch amounts (expressed in nm) achieved as a function of dissolution time (expressed in seconds, s) when using a surface modification solution comprising 50 mM $FeCl_3$ dissolved in IPA to oxidize the molybdenum surface, and a dissolution solution comprising deionized water (DIW) to etch the oxidized molybdenum surface in the wet ALE process shown in FIG. 5. In the graph 820, a molybdenum etch rate of approximately 0.2 nm/cycle was achieved with dissolution times ranging between 5-20 seconds, indicating that the dissolution of the molybdenum oxide passivation layer 225 (e.g., $MoO_yCl_{(x-2y)}$) is also self-limiting during these dissolution times.

Figure 9:
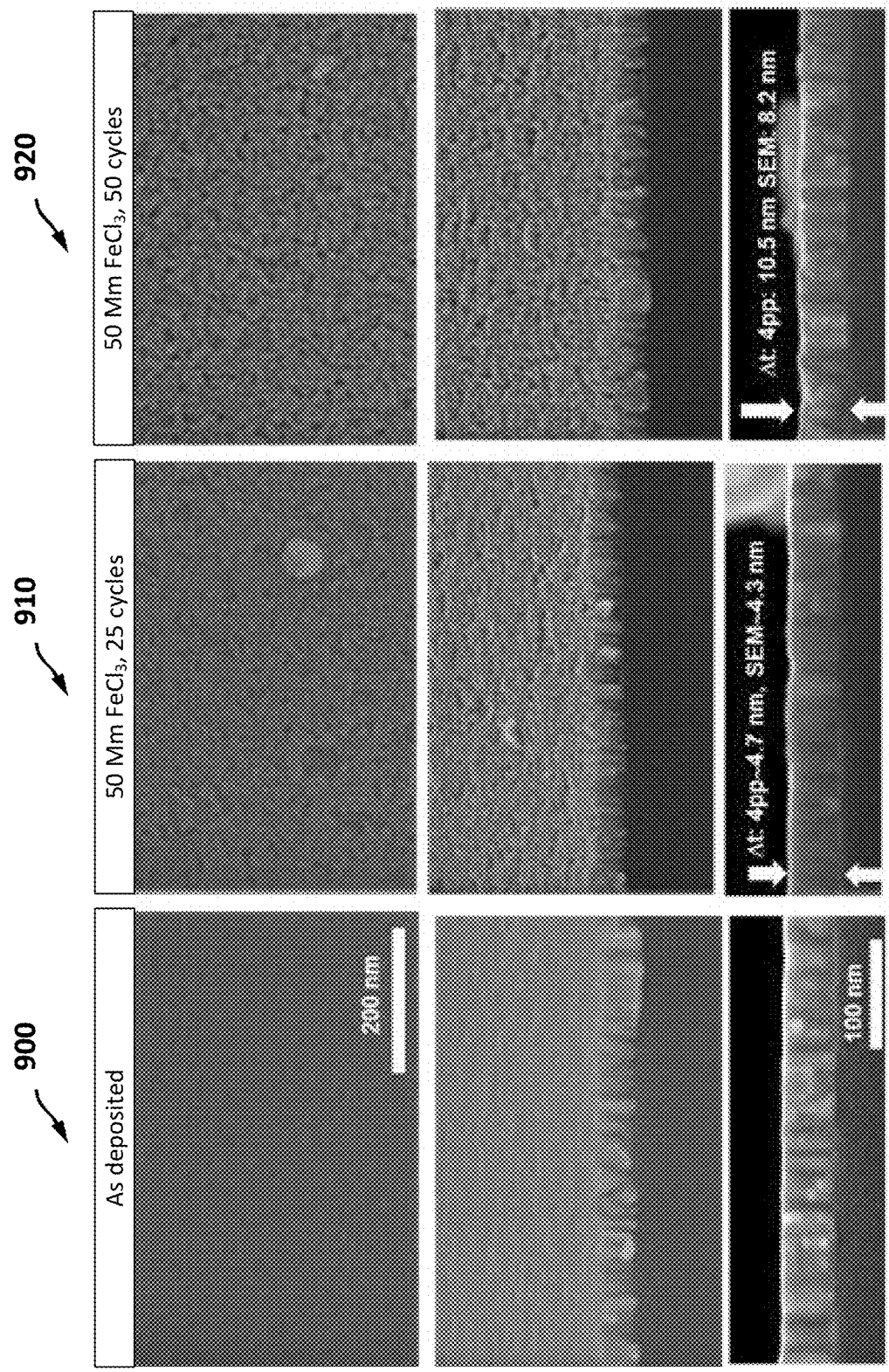
FIG. 9 provides SEM images depicting as-deposited molybdenum and post-etch molybdenum for various etch conditions used in the wet ALE process shown in FIG. 5 when ferric chloride ($FeCl_3$) is used as the oxidizer.

FIG. 9 provides SEM images depicting as-deposited molybdenum (900) and post-etch molybdenum (910, 920) for various etch conditions used in the wet ALE process shown in FIG. 5. In the post-etch SEM images 910 and 920, a coupon was etched using 50 mM $FeCl_3$ in IPA solution in the surface modification step. This etch solution resulted in approximately 4.7 nm of etching after 25 cycles (image 910) and approximately 10.5 nm after 50 cycles (image 920). The post-etch SEM images 910 and 920 show that post-etch surface roughness increases with etch amount. The variations between 4 pp thickness measurements and SEM measurements indicate pitting of the surface.

The wet ALE process shown in FIG. 5 provides new wet etch chemistries and techniques for etching molybdenum. In the wet ALE process shown in FIG. 5, non-peroxide oxidizers having larger reactant molecules are used to improve the self-limiting oxidation behavior in the surface modification step 200, albeit at the expense of surface roughness. In some embodiments, oxidation behavior may be further improved by utilizing additional or alternative oxidation techniques, such as by adding ligands to a non-peroxide oxidizer to provide ligand-assisted oxidation in the surface modification step 200.

Ligand-Assisted Oxidation

Figure 10:
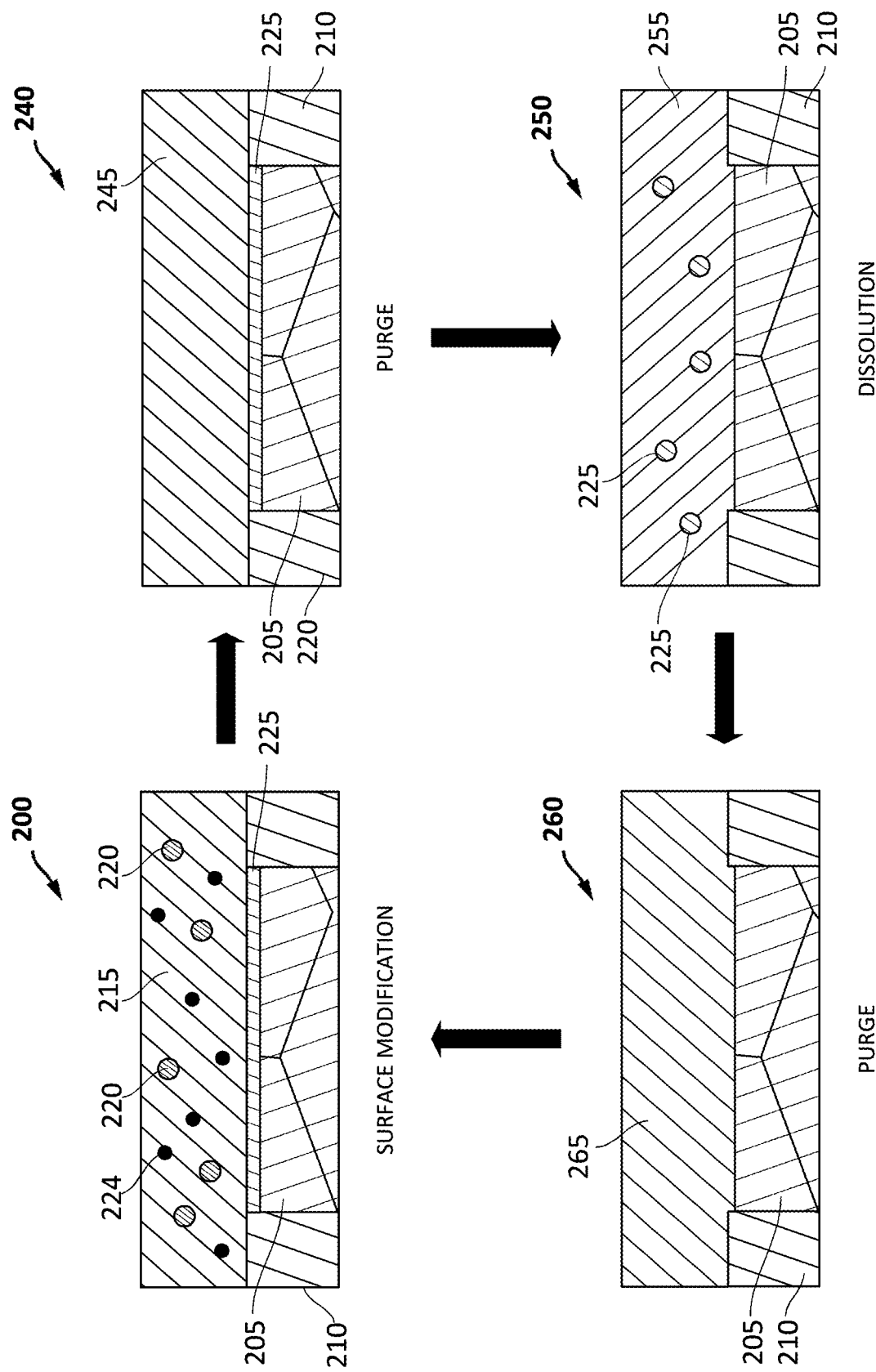
FIG. 10 illustrates yet another example of a cyclic wet ALE process that can be used to etch a transition metal surface, such as a molybdenum surface, in accordance with a third embodiment of the present disclosure.

FIG. 10 illustrates yet another example of a wet ALE process that can be used to etch molybdenum in accordance with a third embodiment of the present disclosure. Like the previous embodiments shown in FIGS. 2 and 5, the wet ALE process shown in FIG. 10 is a cyclical process consisting of one or more ALE cycles, where each ALE cycle includes a surface modification step 200, a first purge step 240, a dissolution step 250 and a second purge step 260.

Like the previous embodiments, the surface of the substrate is exposed to a surface modification solution 215 during the surface modification step 200 to oxidize the surface of the molybdenum layer 205 and form a molybdenum oxide passivation layer 225. Unlike the previous embodiments, the surface modification solution 215 shown in FIG. 10 includes an oxidizer 220 and a ligand species 224 dissolved in a non-aqueous solvent. The oxidizer 220 reacts with the surface of the molybdenum layer 205 to oxidize the molybdenum layer 205 and form the molybdenum oxide passivation layer 225. The ligand species 224 reacts with and binds to the molybdenum oxide passivation layer 225 to change the surface chemistry of the molybdenum oxide passivation layer 225, and in doing so, ensures that the molybdenum oxide passivation layer 225 is self-limiting.

The oxidizer 220 shown in FIG. 10 may include any of the peroxide oxidizers and non-peroxide oxidizers mentioned above. In one embodiment, the oxidizer 220 used in FIG. 10 may be ammonium persulfate (APS), the ligand species 224 may be a carboxylate acid (such as oxalic acid) and the non-aqueous solvent may be an organic solvent (such as methanol). APS dissolved in methanol oxidizes the surface of the molybdenum layer 205 to form a molybdenum oxide passivation layer 225 (such as, for example, molybdenum trioxide, $MoO_3$). Oxalic acid reacts with and binds to the molybdenum surface, changes the surface product and makes the oxidation process strictly self-limiting. Although APS, oxalic acid and methanol are provided herein as examples, other oxidizers, ligand species and non-aqueous solvents may also be utilized, as described in more detail below.

In the third embodiment shown in FIG. 10, the wet ALE process uses ligand-assisted oxidation to ensure self-limiting oxidation behavior. In the wet ALE process shown in FIG. 10, a ligand species 224 (such as, for example, oxalic acid) is added to the surface modification solution 215 to change the surface chemistry of the molybdenum oxide passivation layer 225. Changing the surface chemistry of the molybdenum oxide passivation layer 225 ensures self-limiting oxidation behavior by forming a surface species (e.g., oxymolybdenum oxalate), which is insoluble within the non-aqueous solvent (for example, methanol) included within the surface modification solution 215, but soluble with the aqueous solvent or non-aqueous solvent included within the dissolution solution 255.

After the surface modification step 200 shown in FIG. 10 is performed to form the molybdenum oxide passivation layer 225, the first purge step 240 is performed to remove the surface modification solution 215 and excess reactants from the surface of the substrate. In some embodiments, the first purge solution 245 may use the same solvent (e.g., methanol) used in the surface modification solution 215. However, other solvents may also be utilized, as discussed in more detail below. As noted above, the first purge step 240 may be long enough to completely remove all excess reactants from the substrate surface.

After the substrate is rinsed, the dissolution step 250 is performed to selectively remove the molybdenum oxide passivation layer 225 formed during the surface modification step 200. In the dissolution step 250, the substrate is exposed to the dissolution solution 255 to selectively remove or dissolve the molybdenum oxide passivation layer 225 without removing the unmodified molybdenum layer 205 underlying the molybdenum oxide passivation layer 225 or the dielectric material 210 surrounding the molybdenum layer 205. The dissolution solution 255 contains a reactive agent dissolved in an aqueous or non-aqueous solvent. In some embodiments, the dissolution solution 255 used in the dissolution step 250 shown in FIG. 10 may include hydrochloric acid (HCl) in deionized water (DI $H_2O$). Other reactive agents and solvents may also be utilized, as discussed in more detail below.

After the molybdenum oxide passivation layer 225 is dissolved within the dissolution solution 255, the wet ALE etch cycle shown in FIG. 10 may be completed by performing the second purge step 260 to remove the dissolution solution 255 from the surface of the substrate. In the second purge step 260, the substrate is rinsed with a second purge solution 265, which may be the same or different than the first purge solution 245. In some embodiments, the second purge solution 265 may use the same solvent (e.g., methanol) used within the surface modification solution 215. However, other solvents may also be utilized, as discussed in more detail below. The second purge step 260 may generally continue until the dissolution solution 255 and/or the reactants and soluble species contained within the dissolution solution 255 are completely removed from the surface of the substrate.

The formation of a passivation layer is accomplished in the wet ALE process shown in FIG. 10 by using ligand-assisted oxidation to control the reaction product and avoid forming oxidation products that are soluble in the surface modification solution 215. The ligand species 224 added to the oxidizer 220 prevents continuous etching of the molybdenum surface by changing the surface chemistry of the molybdenum oxide passivation layer 225, thus ensuring self-limiting oxidation behavior by rendering the molybdenum oxide passivation layer insoluble in the surface modification solution 215. The molybdenum oxide passivation layer 225 is then selectively removed in the dissolution solution 255. This prevents the evolution of surface roughness with etch amount, resulting in well-controlled etch uniformity within wafer and from wafer to wafer. The use of ligand binding in the oxidation/surface modification step 200 also prevents preferential grain boundary etching, resulting in better post-etch morphology.

A wide variety of etch chemistries may be used within the surface modification and dissolution solutions shown in FIG. 10. In some embodiments, the surface modification solution 215 may include: (a) a peroxide oxidizer, such as hydrogen peroxide ($H_2O_2$), di-tert-butyl peroxide ($C_8H_{18}O_2$), tert-butyl peroxybenzoate ($C_{11}H_{14}O_3$), tert-butyl hydroperoxide ($C_4H_{10}O_2$), or peroxyacetic acid ($C_2H_4O_3$), or a non-peroxide oxidizer, such as ammonium persulfate (APS), ferric chloride ($FeCl_3$), osmium and ruthenium tetroxides, ruthenates, manganates, permanganates, periodates (and other halide oxyanions), and metal nitrates (such as, e.g. ceric ammonium nitrate), (b) a ligand species, such as oxalic acid, acetic acid, ascorbic acid, mandelic acid, malic acid, maleic acid or fumaric acid, and (c) a non-aqueous organic solvent, such as methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. Other oxidizers, ligand species and non-aqueous organic solvents may also be used within the surface modification solution 215. Like the previous embodiments, the dissolution solution 255 shown in FIG. 10 may be an aqueous acidic solution (containing, e.g., HCl, nitric acid or sulfuric acid), an aqueous basic solution (containing, e.g., $NH_4OH$, TMAH, KOH or $Ca(OH)_2$) or a non-aqueous ligand solution (containing, e.g., alpha-benzoin oxime in acetone, DMSO, MEK or other ketones). In one example embodiment, the dissolution solution 255 may an aqueous dissolution solution comprising hydrochloric acid (HCl). Other reactive agents may also be used in the dissolution solution 255.

Etching experiments were conducted on coupons cut from a 300 mm silicon wafer with various thicknesses of chemical vapor deposition (CVD) molybdenum deposited on one side to investigate the wet ALE process shown in FIG. 10. The etch recipe used to etch the molybdenum includes multiple wet ALE cycles, where each cycle includes a dip in various surface modification solutions (containing, e.g., APS in deionized water, APS in methanol and APS and oxalic acid in methanol), followed by a methanol rinse, a 10 second dip in an aqueous solution of 5 M HCl, and a methanol rinse and blow dry. The wet ALE process was repeated for a number of ALE cycles under different process conditions to investigate the etch rate produced with and without ligand-assisted oxidation, and the effect that ligand addition had on etch rate as a function of oxidation time.

Figure 11A:
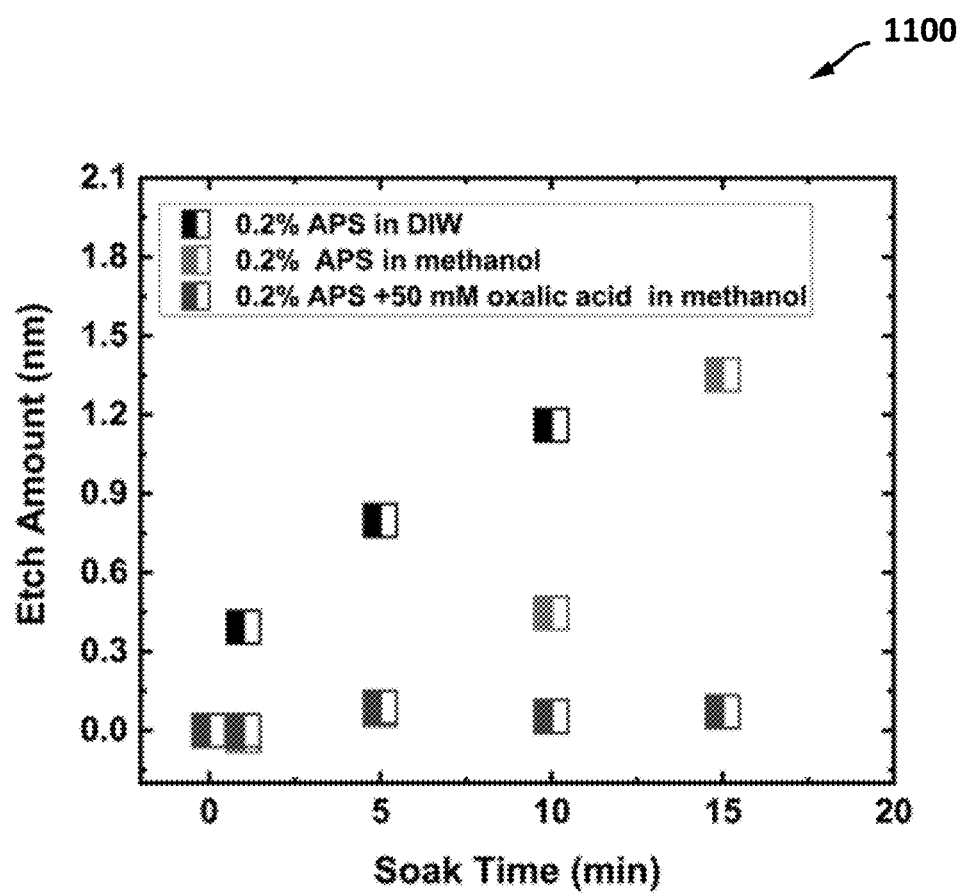
FIG. 11A is a graph depicting exemplary etch amounts (expressed in nm) achieved as a function of oxidation time (expressed in minutes) when using various APS solutions, with and without ligand-assisted oxidation, to oxidize the molybdenum surface in the wet ALE process shown in FIG. 10.

The graph 1100 shown in FIG. 11A depicts exemplary etch amounts (expressed in nm) achieved as a function of oxidation time (expressed in minutes, min) when using various surface modification solutions with and without ligand-assisted oxidation to oxidize the molybdenum surface in the wet ALE process shown in FIG. 10. To obtain the results shown in the graph 1100, the surface of the silicon wafer was exposed to 0.2% APS in DIW, 0.2% APS in methanol and 0.2% APS and 50 mM oxalic acid in methanol solution for variable lengths of time (e.g., 0-15 minutes) to oxidize the molybdenum surface and form a molybdenum oxide passivation layer in three separate wet ALE processes. The graph 1100 shows that oxidation of the molybdenum surface with the 0.2% APS and 50 mM oxalic acid in methanol solution is self-limiting.

Figure 11B:
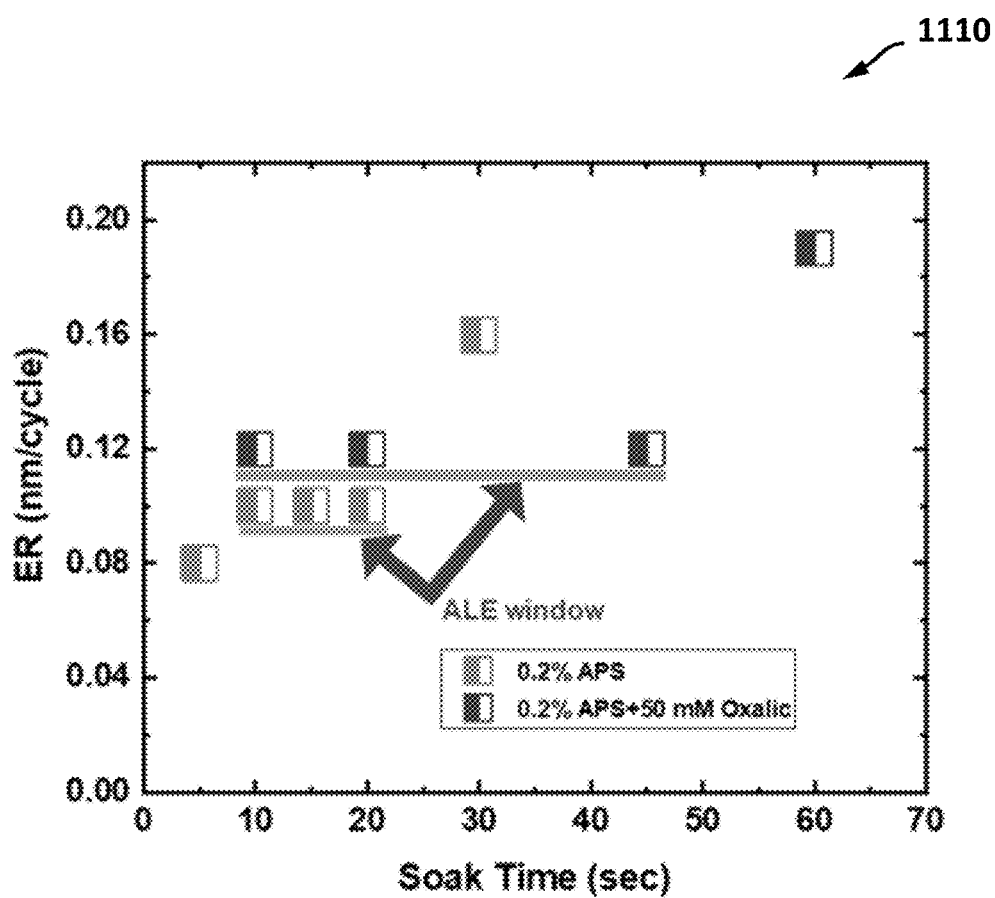
FIG. 11B is a graph depicting exemplary etch amounts (expressed in nm) achieved as a function of oxidation time (expressed in seconds, s) when using a 0.2% APS-methanol solution and a 0.2% APS and 50 mM oxalic acid in methanol solution to oxidize the molybdenum surface in the wet ALE process shown in FIG. 10.

The graph 1110 shown in FIG. 11B depicts exemplary etch amounts (expressed in nm) achieved as a function of oxidation time (expressed in seconds, s) when using a 0.2% APS-methanol solution and a 0.2% APS and 50 mM oxalic acid in methanol solution to oxidize the molybdenum surface in the wet ALE process shown in FIG. 10. To obtain the results shown in the graph 1110, the surface of the silicon wafer was exposed to 0.2% APS in methanol and 0.2% APS and 50 mM oxalic acid in methanol solution for up to a minute in two separate wet ALE processes. The graph 1110 shows that the ALE window (e.g., approximately 35 seconds) after ligand-assisted oxidation using the 0.2% APS and 50 mM oxalic acid solution is larger than the ALE window (e.g., approximately 10 seconds) produced when using 0.2% APS in methanol alone to oxidize the molybdenum surface. Thus, the graph 1110 shows that adding a ligand (e.g., oxalic acid) to the 0.2% APS-methanol solution significantly expands the ALE window (by more than three times).

Figure 11C:
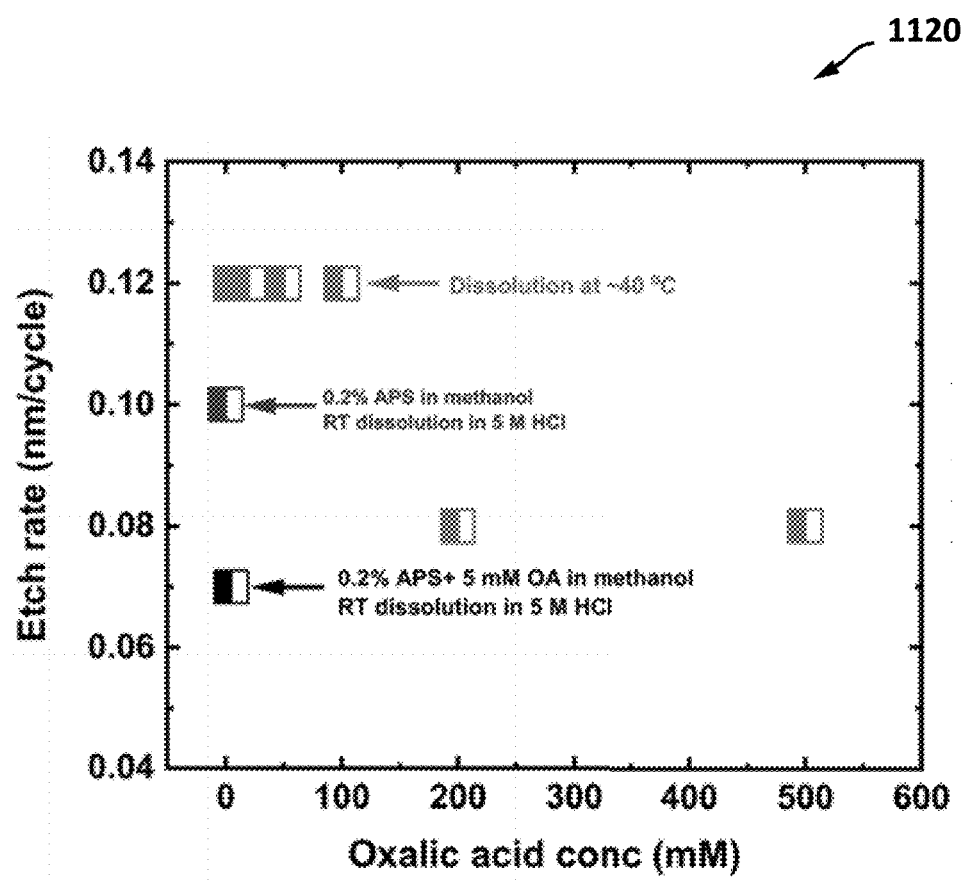
FIG. 11C is a graph depicting exemplary etch amounts (expressed in nm) achieved as a function of ligand concentration (e.g., oxalic acid concentration, expressed in millimoles, mM) and dissolution temperature when using the wet ALE process shown in FIG. 10.

The graph 1120 shown in FIG. 11C depicts exemplary etch amounts (expressed in nm) achieved as a function of ligand concentration (expressed in millimoles, mM) and dissolution temperature when using the wet ALE process shown in FIG. 10. As shown in the graph 1120, a lower etch rate (e.g., 0.07 nm/cycle vs. 0.1 nm/cycle) is produced after adding only 5 mM of oxalic acid to 0.2% APS-methanol solution. The lower etch rate shown in graph 1120 indicates a change in the surface chemistry of the molybdenum oxide passivation layer. The etch rate is independent of ligand concentration up to about 100 mM of oxalic acid, beyond which the etch rate drops down before remaining independent of oxalic acid concentration again. The drop in etch rate may be due to a change in the product stoichiometry. In some embodiments, the etch rate may be increased by dissolving the molybdenum oxide passivation layer at an elevated temperature. For example, the graph 1120 shows that the etch rate is increased to about 0.12 nm/cycle when a dissolution temperature of about 40° C. is utilized in the dissolution step.

Figure 12:
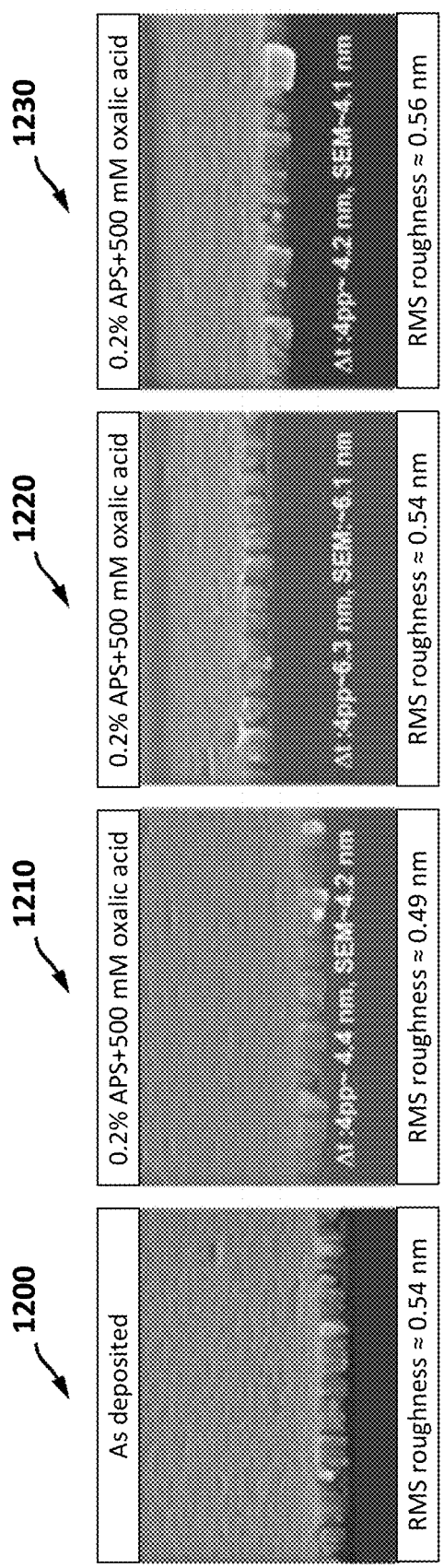
FIG. 12 provides SEM images depicting as-deposited molybdenum and post-etch molybdenum for various etch conditions used in the wet ALE process shown in FIG. 10.

FIG. 12 provides SEM images depicting as-deposited molybdenum (1200) and post-etch molybdenum (1210, 1220, 1230) for various etch conditions used in the wet ALE process shown in FIG. 10. In the post-etch SEM images 1210, 1220 and 1230, a coupon was etched using 0.2% APS and 500 mM oxalic acid in methanol solution as the surface modification solution followed by dissolution in 5 M HCl at 40° C. for varying ALE cycle numbers. This etch solution resulted in approximately 4.4 nm of etching after 50 cycles (image 1210), approximately 6.3 nm after 70 cycles (image 1220) and approximately 4.2 nm after 45 cycles (image 1230). The post-etch SEM images 1210, 1220 and 1230 show that the post-etch surface of the molybdenum film is improved compared to other oxidizing solutions, and either improved or roughly the same as the reference coupon (image 1200). The improved post-etch surface smoothness is attributed to the ligand addition, which changes the surface chemistry of the molybdenum oxide passivation layer and prevents molybdenum from pulling off the surface.

The wet ALE process shown in FIG. 10 provides new wet etch chemistries and techniques for etching molybdenum. In the wet ALE process shown in FIG. 10, ligand-assisted oxidation is used to change the surface chemistry of the molybdenum oxide passivation layer and ensure self-limiting oxidation behavior in the surface modification step. Compared to the 0.2% APS-methanol solution, the addition of a ligand species (e.g., oxalic acid) to the surface modification solution minimizes the preferential grain boundary attack by the oxidizer (APS), significantly expands the ALE window and preserves the post-etch surface smoothness. A wide variety of ligand species may be added to the surface modification solution to achieve the results mentioned above. Although oxalic acid is provided as one example, other suitable ligand species include, but are not limited to, carboxylic acids such as acetic acid, ascorbic acid, mandelic acid, malic acid, maleic acid and fumaric acid.

Figure 13:
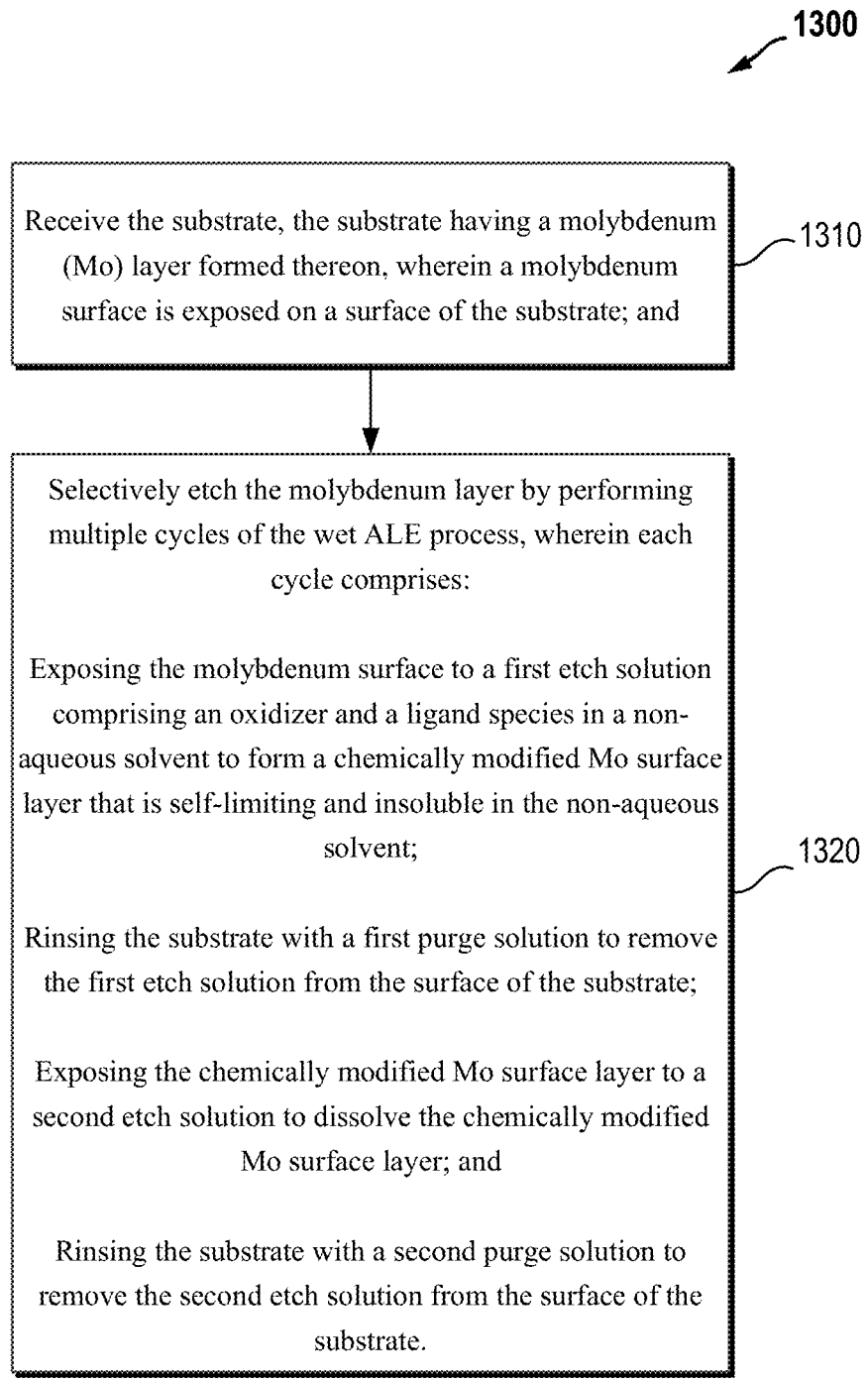
FIG. 13 is a flowchart diagram illustrating one embodiment of a method that utilizes the ligand-assisted oxidation techniques shown in FIG. 10 for etching a substrate using a wet ALE process.

FIG. 13 illustrates another embodiment of a method 1300 that can be used for etching a substrate using a wet atomic layer etching (ALE) process. More specifically, FIG. 13 illustrates a method 1300 that can be used to etch a substrate having a molybdenum (Mo) layer formed thereon using a wet ALE process, which utilizes ligand-assisted oxidation to oxidize the molybdenum surface. It will be recognized that the embodiment of FIG. 13 is merely exemplary and additional methods may utilize the wet ALE techniques described herein. Further, additional processing steps may be added to the method shown in the FIG. 13 as the steps described are not intended to be exclusive. Moreover, the order of the steps is not limited to the order shown in the figures as different orders may occur and/or various steps may be performed in combination or at the same time.

The method 1300 shown in FIG. 13 begins by receiving the substrate, the substrate having a molybdenum (Mo) layer formed thereon, wherein a molybdenum surface is exposed on a surface of the substrate (in step 1310). Then, in step 1320, the method 1300 includes selectively etching the molybdenum layer by performing multiple cycles of the wet ALE process, wherein each cycle comprises: (a) exposing the molybdenum surface to a first etch solution comprising an oxidizer and a ligand species in a non-aqueous solvent to form a chemically modified Mo surface layer that is self-limiting and insoluble in the non-aqueous solvent; (b) rinsing the substrate with a first purge solution to remove the first etch solution from the surface of the substrate; (c) exposing the chemically modified Mo surface layer to a second etch solution to dissolve the chemically modified Mo surface layer; and (d) rinsing the substrate with a second purge solution to remove the second etch solution from the surface of the substrate.

In the method 1300, the oxidizer included within the first etch solution reacts with the molybdenum surface to oxidize the molybdenum surface and form the chemically modified Mo surface layer. The ligand species included within the first etch solution reacts with and binds to the chemically modified Mo surface layer to change a surface chemistry of the chemically modified Mo surface layer. Changing the surface chemistry ensures that the chemically modified Mo surface layer is self-limiting and insoluble in the non-aqueous solvent. A wide variety of oxidizers, ligand species and non-aqueous solvents may be utilized in the first etch solution, as described above in reference to FIG. 10.

In one example embodiment, the first etch solution may include APS (as the oxidizer), oxalic acid (as the ligand species) and methanol (as the non-aqueous solvent). However, other oxidizers, ligand species and non-aqueous solvents may also be used in the first etch solution to provide the ligand-assisted oxidation of the molybdenum surface, which renders the chemically modified Mo surface layer insoluble in the non-aqueous solvent and ensures self-limiting oxidation behavior. Although insoluble in the non-aqueous solvent used in the first etch solution, the chemically modified Mo surface layer is soluble within the second etch solution. In one example embodiment, the second etch solution may include a reactive agent (such as an acid or a base) dissolved in aqueous solvent. For example, the second etch solution may be an aqueous acidic solution comprising hydrochloric acid (HCl), nitric acid or sulfuric acid, or an aqueous basic solution comprising ammonium hydroxide ($NH_4OH$), tetramethylammonium hydroxide (TMAH), potassium hydroxide (KOH) or calcium hydroxide ($Ca(OH)_2$). In another example embodiment, the second etch solution may be a non-aqueous ligand solution comprising, for example, alpha-benzoin oxime in acetone, dimethyl sulfoxide (DMSO), methyl-ethyl ketone (MEK) and other ketones.

The wet ALE processes described above and shown in FIGS. 1, 5 and 10 for etching molybdenum can be accomplished using a variety of techniques. For example, the molybdenum wet ALE processes disclosed above may be performed by dipping the molybdenum sample in beakers of each etch solution. In this case, purging can be accomplished by either rinsing or dipping the sample in an appropriate solvent bath. The molybdenum wet ALE processes can also be accomplished on a spinner. For example, the molybdenum sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of metal. For high volume manufacturing, dispensing of etch solutions and rinses can be executed using conventional tools, such as wet etching tools and rinse tools.

Example process conditions (e.g., etch chemistry, temperature, processing time, etc.) are provided herein for etching transition metals, and more specifically, for etching molybdenum using the wet ALE processes described above and shown in FIGS. 1, 5 and 10. It will be recognized by those skilled in the art, however, that the wet ALE processes disclosed herein are not strictly limited to the example process conditions described herein and may be performed using a wide variety of process conditions depending on the material being etched.

Figure 14:
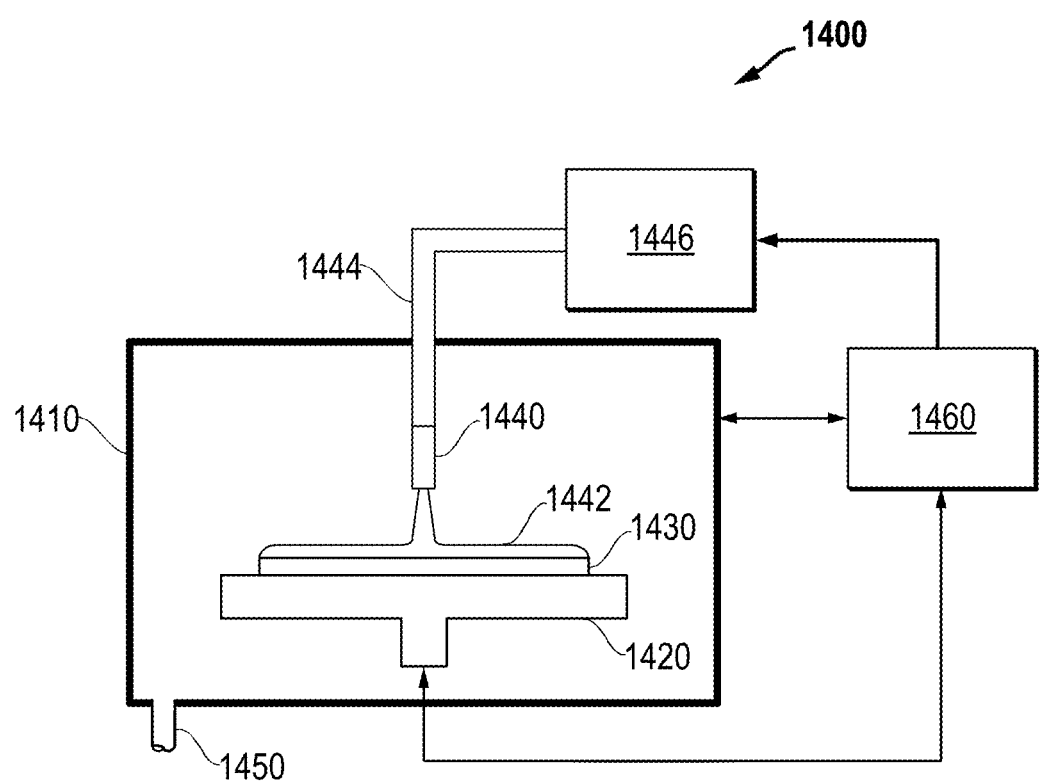
FIG. 14 is a block diagram illustrating one embodiment of a processing system that can be used to etch a transition metal surface, such as a molybdenum surface, using the wet ALE processes disclosed herein.

FIG. 14 illustrates one embodiment of a processing system 1400 that can etch a transition metal surface, such as a molybdenum surface, on a surface of a substrate 1430 using the wet ALE processes disclosed herein. As shown in FIG. 14, the processing system 1400 includes a process chamber 1410, which in some embodiments, may be a pressure controlled chamber. In the embodiment shown in FIG. 14, the process chamber 1410 is a spin chamber having a spinner 1420 (or spin chuck), which is configured to spin or rotate at a rotational speed. A substrate 1430 is held on the spinner 1420, for example, via electrostatic force or vacuum pressure. In one example, the substrate 1430 may be a semiconductor wafer having a transition metal, such as molybdenum, formed on or within the substrate 1430.

The processing system 1400 shown in FIG. 14 further includes a liquid nozzle 1440, which is positioned over the substrate 1430 for dispensing various etch solutions 1442 onto a surface of the substrate 1430. The etch solutions 1442 dispensed onto the surface of the substrate 1430 may generally include a surface modification solution to chemically modify the molybdenum surface and form a modified surface layer (e.g., a molybdenum oxide, a molybdenum chloride or a molybdenum oxychloride passivation layer), and a dissolution solution to selectively remove the modified surface layer from the molybdenum surface. Purge solutions may also be dispensed onto the surface of the substrate 1430 between surface modification and dissolution steps to separate the surface modification and dissolution solutions. Examples of surface modification, dissolution and purge solutions are discussed above.

As shown in FIG. 14, the etch solutions 1442 may be stored within a chemical supply system 1446, which may include one or more reservoirs for holding the various etch solutions 1442 and a chemical injection manifold, which is fluidly coupled to the process chamber 1410 via a liquid supply line 1444. In operation, the chemical supply system 1446 may selectively apply desired chemicals to the process chamber 1410 via the liquid supply line 1444 and the liquid nozzle 1440 positioned within the process chamber 1410. Thus, the chemical supply system 1446 can be used to dispense the etch solutions 1442 onto the surface of the substrate 1430. The process chamber 1410 may further include a drain 1450 for removing the etch solutions 1442 from the process chamber 1410.

Components of the processing system 1400 can be coupled to, and controlled by, a controller 1460, which in turn, can be coupled to a corresponding memory storage unit and user interface (not shown). Various processing operations can be executed via the user interface, and various processing recipes and operations can be stored in the memory storage unit. Accordingly, a given substrate 1430 can be processed within the process chamber 1410 in accordance with a particular recipe. In some embodiments, a given substrate 1430 can be processed within the process chamber 1410 in accordance with an etch recipe that utilizes the wet ALE techniques described herein for etching molybdenum.

The controller 1460 shown in block diagram form in FIG. 14 can be implemented in a wide variety of manners. In one example, the controller 1460 may be a computer. In another example, the controller 1460 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 14, the controller 1460 may be coupled to various components of the processing system 1400 to receive inputs from, and provide outputs to, the components. For example, the controller 1460 may be coupled to: the process chamber 1410 for controlling the temperature and/or pressure within the process chamber 1410; the spinner 1420 for controlling the rotational speed of the spinner 1420; and the chemical supply system 1446 for controlling the various etch solutions 1442 dispensed onto the substrate 1430. The controller 1460 may control other processing system components not shown in FIG. 14, as is known in the art.

In some embodiments, the controller 1460 may control the various components of the processing system 1400 in accordance with an etch recipe that utilizes the wet ALE techniques described herein for etching molybdenum (Mo). For example, the controller 1460 may supply various control signals to the chemical supply system 1446, which cause the chemical supply system 1446 to: a) dispense a surface modification solution onto the surface of the substrate 1430 to chemically modify exposed surfaces of the molybdenum and create a chemically modified Mo surface layer (e.g., a molybdenum oxide, a molybdenum chloride or a molybdenum oxychloride passivation layer) on the substrate 1430; b) rinse the substrate 1430 with a first purge solution to remove the surface modification solution and excess reactants from the surface; c) dispense a dissolution solution onto the surface of the substrate 1430 to selectively remove or dissolve the chemically modified Mo surface layer; and d) rinse the substrate with a second purge solution to remove the dissolution solution from the surface of the substrate 1430. In some embodiments, the controller 1460 may supply the control signals to the chemical supply system 1446 in a cyclic manner, such that the steps a)-d) are repeated for one or more ALE cycles, until a desired amount of the molybdenum has been removed.

The controller 1460 may also supply control signals to other processing system components. In some embodiments, for example, the controller 1460 may supply control signals to the spinner 1420 and/or the chemical supply system 1446 to dry the substrate 1430 after the second purge step is performed. In one example, the controller 1460 may control the rotational speed of the spinner 1420, so as to dry the substrate 1430 in a spin dry step. In another example, control signals supplied from the controller 1460 to the chemical supply system 1446 may cause a drying agent (such as, e.g., isopropyl alcohol) to be dispensed onto the surface of the substrate 1430 to further assist in drying the substrate before performing the spin dry step.

In some embodiments, the controller 1460 may control the temperature and/or the pressure within the process chamber 1410. In some embodiments, the surface modification, dissolution and purge steps of the molybdenum wet ALE processes described herein may be performed at roughly the same temperature and pressure. In one example implementation, the surface modification, dissolution and purge steps may each be performed at (or near) atmospheric pressure and room temperature. Performing the processing steps within the same process chamber at roughly the same temperature and pressure decreases the cycle time and improves the throughput of the wet ALE process described herein by avoiding unnecessary chamber transitions and temperature/pressure changes.

It is noted, however, that the embodiments described herein are not strictly limited to only atmospheric pressure and room temperature, nor are they limited to a particular process chamber. In other embodiments, one or more of the surface modification, dissolution and purge steps can be run at above atmospheric pressure in a pressure vessel, or at reduced pressure in a vacuum chamber. Etch solutions can be dispensed in these environments as long as the vapor pressure of the liquid is lower than the chamber pressure. For these implementations, a spinner with a liquid dispensing nozzle would be placed in the pressure vessel or vacuum chamber. The temperature of the liquid being dispensed can be elevated to any temperature below its boiling point at the pressure of the process. In one example implementation, the dissolution step may be performed at an elevated temperature (for example, at about 40° C.) to increase the kinetics of dissolution.

The present disclosure provides systems and methods that utilize new etch chemistries for etching molybdenum (Mo) in a wet ALE process. As described above, the wet ALE processes and methods disclosed herein use a wide variety of techniques and etch chemistries to oxidize a molybdenum layer exposed on a surface of a substrate and form a self-limiting, molybdenum oxide passivation layer (e.g., molybdenum oxide, a molybdenum chloride or a molybdenum oxychloride passivation layer) in a surface modification step of the wet ALE process. For example, the wet ALE processes and methods disclosed herein may use: (a) ultraviolet (UV) photolysis of peroxide oxidizers to create oxidizing radicals, which limit oxidation of the molybdenum surface and provide quasi-self-limiting oxidation behavior, (b) steric hinderance of oxidizers having relatively large reactant molecules to achieve better self-limiting oxidation behavior, and/or (c) ligand-assisted oxidation to change the surface chemistry of the molybdenum oxide passivation layer and ensure self-limiting oxidation behavior. Unlike conventional methods and chemistries used for etching molybdenum, the new wet etch chemistries and methods described herein may be used, alone or in combination, to improve the oxidation behavior of the molybdenum surface in the surface modification step and/or provide a molybdenum oxide passivation layer, which is self-limiting and insoluble in the surface modification solution. Although described herein for etching molybdenum, the techniques described herein may also be used for etching other transition metals such as, but not limited to, cobalt (Co), copper (Cu), tungsten (W), vanadium (V), niobium (Nb), tantalum (Ta), titanium (Ti), chromium (Cr) and nickel (Ni).

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:
receiving a substrate having a molybdenum (Mo) layer formed thereon, wherein a molybdenum surface is exposed on a surface of the substrate;
exposing the surface of the substrate to a surface modification solution comprising an oxidizer dissolved in a non-aqueous solvent, wherein the oxidizer reacts with the molybdenum surface to oxidize the molybdenum surface and form a molybdenum oxide passivation layer, which is self-limiting and insoluble in the non-aqueous solvent;
removing the surface modification solution from the surface of the substrate subsequent to forming the molybdenum oxide passivation layer;
exposing the surface of the substrate to a dissolution solution to selectively remove the molybdenum oxide passivation layer, wherein the dissolution solution reacts with the molybdenum oxide passivation layer to form soluble species that are dissolved by the dissolution solution, wherein the dissolution solution is an aqueous acidic solution, an aqueous basic solution or a non-aqueous ligand solution; and removing the dissolution solution and the soluble species from the surface of the substrate to etch the molybdenum layer.

2. The method of claim 1, further comprising repeating said exposing the surface of the substrate to the surface modification solution, removing the surface modification solution, exposing the surface of the substrate to the dissolution solution, and removing the dissolution solution and the soluble species a number of times until a predetermined amount of the molybdenum layer is removed from the substrate.

3. The method of claim 1, wherein the surface modification solution further comprises a ligand species, which reacts with the molybdenum oxide passivation layer to change a surface chemistry of the molybdenum oxide passivation layer, and wherein changing the surface chemistry ensures that the molybdenum oxide passivation layer is self-limiting and insoluble in the non-aqueous solvent.

4. The method of claim 3, wherein the oxidizer comprises a peroxide oxidizer or a non-peroxide oxidizer, the ligand species comprises a carboxylic acid and the non-aqueous solvent comprises an organic solvent.

5. The method of claim 3, wherein the oxidizer comprises ammonium persulfate (APS), wherein the ligand species comprises oxalic acid, acetic acid, ascorbic acid, mandelic acid, malic acid, maleic acid or fumaric acid, and wherein the non-aqueous solvent comprises methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate.

6. The method of claim 1, wherein the oxidizer comprises a large reactant molecule having a molecular size substantially greater than 2 angstroms and a smaller diffusion coefficient compared to a smaller reactant molecule having a molecular size less than 2 angstroms, wherein the smaller diffusion coefficient of the large reactant molecule reduces an oxidation rate at which the oxidizer oxidizes the molybdenum surface to form the molybdenum oxide passivation layer, and wherein reducing the oxidation rate improves self-limiting oxidation behavior of the oxidizer.

7. The method of claim 6, wherein the oxidizer comprises a non-peroxide oxidizer having the large reactant molecule, and wherein the non-aqueous solvent comprises an organic solvent.

8. The method of claim 7, wherein the non-peroxide oxidizer comprises ammonium persulfate (APS), ferric chloride ($FeCl_3$), an osmium tetroxide, a ruthenium tetroxide, a ruthenate, a manganate, a permanganate, a periodate, or a metal nitrate.

9. The method of claim 7, wherein the non-peroxide oxidizer comprises ammonium persulfate (APS), and wherein the non-aqueous solvent comprises methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate.

10. The method of claim 7, wherein the non-peroxide oxidizer comprises ferric chloride ($FeCl_3$) and the non-aqueous solvent comprises isopropyl alcohol (IPA) or acetone, and wherein the ferric chloride reacts with the molybdenum surface to oxidize the molybdenum surface and form a molybdenum oxychloride passivation layer, which is self-limiting and insoluble in the non-aqueous solvent.

11. The method of claim 6, wherein the oxidizer comprises a peroxide oxidizer having the large reactant molecule, and wherein the non-aqueous solvent comprises an organic solvent.

12. The method of claim 11, wherein the peroxide oxidizer comprises di-tert-butyl peroxide ($C_8H_{18}O_2$)) or tert-butyl peroxybenzoate ($C_{11}H_{14}O_3$), and wherein the non-aqueous solvent comprises methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate.

13. The method of claim 1, wherein the dissolution solution is an aqueous acidic solution comprising hydrochloric acid (HCl), nitric acid or sulfuric acid, an aqueous basic solution comprising ammonium hydroxide ($NH_4OH$), tetramethylammonium hydroxide (TMAH), potassium hydroxide (KOH) or calcium hydroxide ($Ca(OH)_2$), or a non-aqueous ligand solution comprising alpha-benzoin oxime in acetone, dimethyl sulfoxide (DMSO), methyl-ethyl ketone (MEK) or another ketone.

14. A method of etching a substrate using a wet atomic layer etching (ALE) process, the method comprising:
receiving the substrate, the substrate having a molybdenum (Mo) layer formed thereon, wherein a molybdenum surface is exposed on a surface of the substrate; and
selectively etching the molybdenum layer by performing multiple cycles of the wet ALE process, wherein each cycle comprises:
exposing the molybdenum surface to a first etch solution comprising an oxidizer and a ligand species in a non-aqueous solvent to form a chemically modified Mo surface layer that is self-limiting and insoluble in the non-aqueous solvent;
rinsing the substrate with a first purge solution to remove the first etch solution from the surface of the substrate;
exposing the chemically modified Mo surface layer to a second etch solution to dissolve the chemically modified Mo surface layer, wherein the second etch solution is an aqueous acidic solution, an aqueous basic solution or a non-aqueous ligand solution; and
rinsing the substrate with a second purge solution to remove the second etch solution from the surface of the substrate.

15. The method of claim 14, wherein the oxidizer reacts with the molybdenum surface to oxidize the molybdenum surface and form the chemically modified Mo surface layer, wherein the ligand species reacts with the chemically modified Mo surface layer to change a surface chemistry of the chemically modified Mo surface layer, and wherein changing the surface chemistry ensures that the chemically modified Mo surface layer is self-limiting and insoluble in the non-aqueous solvent.

16. The method of claim 14, wherein the oxidizer comprises ammonium persulfate (APS), ferric chloride ($FeCl_3$), an osmium tetroxide, a ruthenium tetroxide, a ruthenate, a manganate, a permanganate, a periodate, a metal nitrate, hydrogen peroxide ($H_2O_2$), or another peroxide.

17. The method of claim 14, wherein the ligand species comprises a carboxylic acid and the non-aqueous solvent comprises an organic solvent.

18. The method of claim 14, wherein the ligand species comprises oxalic acid, acetic acid, ascorbic acid, mandelic acid, malic acid, maleic acid or fumaric acid, and wherein the non-aqueous solvent comprises methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate.

19. The method of claim 14, wherein the second etch solution is an aqueous acidic solution comprising hydrochloric acid (HCl), nitric acid or sulfuric acid, an aqueous basic solution comprising hydroxide ammonium ($NH_4OH$), tetramethylammonium hydroxide (TMAH), potassium hydroxide (KOH) or calcium hydroxide ($Ca(OH)_2$), or a non-aqueous ligand solution comprising alpha-benzoin oxime in acetone, dimethyl sulfoxide (DMSO), methyl-ethyl ketone (MEK) or another ketone.

20. A method of etching, the method comprising:
receiving a substrate having a molybdenum (Mo) layer formed thereon, wherein a molybdenum surface is exposed on a surface of the substrate;
exposing the surface of the substrate to a surface modification solution comprising an oxidizer dissolved in a non-aqueous solvent, wherein the oxidizer reacts with the molybdenum surface to oxidize the molybdenum surface and form a molybdenum oxide passivation layer, which is self-limiting and insoluble in the non-aqueous solvent;
removing the surface modification solution from the surface of the substrate subsequent to forming the molybdenum oxide passivation layer;
exposing the surface of the substrate to a dissolution solution to selectively remove the molybdenum oxide passivation layer, wherein the dissolution solution reacts with the molybdenum oxide passivation layer to form soluble species that are dissolved by the dissolution solution; and
removing the dissolution solution and the soluble species from the surface of the substrate to etch the molybdenum layer;
wherein during said exposing the surface of the substrate to the surface modification solution, the method further comprises:
exposing the surface of the substrate to ultra-violet (UV) radiation to photolyze the oxidizer and create oxidizing radicals, which react with the molybdenum surface to oxidize the molybdenum surface and form the molybdenum oxide passivation layer, wherein a lifetime of the oxidizing radicals limits oxidation of the molybdenum oxide passivation layer to provide quasi-self-limiting oxidation behavior.

21. The method of claim 20, wherein the oxidizer comprises a peroxide oxidizer and the non-aqueous solvent comprises an organic solvent.

22. The method of claim 20, wherein the oxidizer comprises hydrogen peroxide ($H_2O_2$), a symmetric organic peroxide, an asymmetric organic peroxide, a monoperoxide, or a peroxy acid, and wherein the non-aqueous solvent comprises methanol ($CH_3OH$), diethyl ether ($(C_2H_5)_2O$), acetonitrile ($C_2H_3N$), dimethyl sulfoxide ($C_2H_6OS$), isopropyl alcohol (IPA), another alcohol, a ketone or an acetate.

* * * * *